US011489047B2

(12) United States Patent
Okamoto et al.

(10) Patent No.: US 11,489,047 B2
(45) Date of Patent: Nov. 1, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yasuhiro Okamoto, Tokyo (JP); Nobuo Machida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 113 days.

(21) Appl. No.: 17/068,378

(22) Filed: Oct. 12, 2020

(65) Prior Publication Data
US 2021/0159315 A1    May 27, 2021

(30) Foreign Application Priority Data

Nov. 21, 2019   (JP) .............................. JP2019-210320

(51) Int. Cl.
| H01L 29/16 | (2006.01) |
| H01L 29/66 | (2006.01) |
| H01L 29/739 | (2006.01) |
| H01L 29/423 | (2006.01) |
| H01L 29/08 | (2006.01) |
| H01L 29/417 | (2006.01) |
| H01L 29/06 | (2006.01) |

(52) U.S. Cl.
CPC ...... *H01L 29/1608* (2013.01); *H01L 29/0696* (2013.01); *H01L 29/0804* (2013.01); *H01L 29/0821* (2013.01); *H01L 29/0834* (2013.01); *H01L 29/41708* (2013.01); *H01L 29/4236* (2013.01); *H01L 29/66068* (2013.01); *H01L 29/66348* (2013.01); *H01L 29/7396* (2013.01); *H01L 29/7397* (2013.01)

(58) Field of Classification Search
CPC ............. H01L 29/1608; H01L 29/0696; H01L 29/0804; H01L 29/0821; H01L 29/0834; H01L 29/41708; H01L 29/4236; H01L 29/66068; H01L 29/66348; H01L 29/7396; H01L 29/7397
USPC ....................................................... 257/288
See application file for complete search history.

(56) References Cited

U.S. PATENT DOCUMENTS

| 2014/0225126 A1* | 8/2014 | Aketa ............... H01L 21/30604 257/77 |
| 2017/0162564 A1* | 6/2017 | Aketa ............... H01L 29/41766 |
| 2019/0198663 A1* | 6/2019 | Sakai .................. H01L 29/0865 |
| 2021/0074816 A1* | 3/2021 | Sakai .................. H01L 29/7811 |

OTHER PUBLICATIONS

Naoki Watanabe, et al., "6.5 kV n-Channel 4H-SiC IGBT with Low Switching Loss Achieved by Extremely Thin Drift Layer", Materials Science Forum, vol. 858, Submitted: Sep. 15, 2015, pp. 939-944.

* cited by examiner

*Primary Examiner* — Igwe U Anya
(74) *Attorney, Agent, or Firm* — McDermott Will & Emery LLP

(57) ABSTRACT

To improve an on-resistance of a semiconductor device. A plurality of collector regions are formed at a predetermined interval on a bottom surface of a drift layer made of SiC. Next, on the bottom surface of the drift layer, both of the drift layer and a collector region via a silicide layer are connected to a collector electrode.

11 Claims, 23 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2019-210320 filed on Nov. 21, 2019 including the specification, drawings and abstract is incorporated herein by reference in its entirety.

BACKGROUND

The present embodiments relate to a semiconductor device and a method of manufacturing the same.

There is a semiconductor device using silicon carbide (SiC) for a power transistor. Since SiC has a wide energy band gap, a maximum insulating electric field is about an order of magnitude higher than that of silicon (Si). Therefore, a dielectric breakdown voltage of the semiconductor device using SiC is increased. In particular, the dielectric breakdown voltage of an insulated gate type bipolar transistor (IGBT: Insulated Gate Bipolar Transistor) using SiC is noticed because it exceeds the dielectric breakdown voltage of IGBT using Si.

An IGBT using SiC has, for example, an n-type drift layer made of SiC, a p-type emitter region selectively formed by ion implantation in the n-type drift layer, and a p-type collector region uniformly formed on a surface opposite to a surface on which the p-type emitter region of the n-type drift layer is formed. Such the IGBT using SiC is described in, for example, Naoki Watanabe, 4 others, Material Science Forum, 2016, Vol. 858, p. 939-944 (Non-patent Document 1).

SUMMARY

In IGBT, a pn-junction is formed between the n-type drift layer and the p-type emitter region. The pn-junction causes a potential difference, that is, a built-in potential, in a current path of the IGBT. In case of the IGBT using Si, the built-in potential is about 1 V. On the other hand, in case of the IGBT using SiC, the built-in potential is about 3 V, because it is used a material with the wide energy band gap. When the built-in potential is high, there is a problem that a threshold voltage (offset voltage) when a current flow through the IGBT becomes high and an on-resistance becomes high. Therefore, the semiconductor device described in Non-Patent Document 1 has room for improvement in viewpoint of the on-resistance.

A problem is to improve the on-resistance when a current flow in the IGBT using SiC. Other problems and novel features will become apparent from descriptions of specification and drawings.

According to an embodiment, the semiconductor device includes a semiconductor layer of a first conductivity type having a first main surface and a second main surface and configured to contain silicon and carbon, a first impurity region of a second conductivity type formed on the first main surface, a second impurity region of the first conductivity type formed on the first main surface such that contacting the first impurity region, a trench which penetrates the first impurity region and the second impurity region and reaches the semiconductor layer and extend in a first direction in plan view, a gate insulating film formed in the trench, a gate electrode embedded in the trench with the gate insulating film interposed therebetween, a plurality of third impurity regions of the second conductivity type selectively formed in the second main surface, a metal film formed such that covering the second main surface, the plurality of third impurity regions are arranged at a predetermined interval in a second direction intersecting the first direction in plan view, and the metal film is contacted both of the semiconductor layer and the plurality of third impurity regions in the second main surface.

According to another embodiment, the semiconductor device includes a semiconductor layer of a first conductivity type having a first main surface and a second main surface and configured to contain silicon and carbon, a first impurity region of a second conductivity type formed on the first main surface, a second impurity region of the first conductivity type formed on the first main surface such that contacting the first impurity region, a trench which penetrates the first impurity region and the second impurity region and reaches the semiconductor layer and extend in a first direction in plan view, a gate insulating film formed in the trench, a gate electrode embedded in the trench with the gate insulating film interposed therebetween, a third impurity region of the first conductivity type formed in the second main surface and having a higher impurity concentration than the semiconductor layer thereof, a plurality of forth impurity regions of the second conductivity type selectively formed in the third impurity region in the second main surface, a metal film formed such that covering the second main surface, the plurality of forth impurity regions are arranged at a predetermined interval in a second direction intersecting the first direction in plan view, and the metal film is contacted both of the third impurity region and the plurality of forth impurity regions in the second main surface.

In the semiconductor device according to the embodiments, it is possible to improve the on-resistance of the semiconductor device.

DETAILED DESCRIPTION

Figure 1:
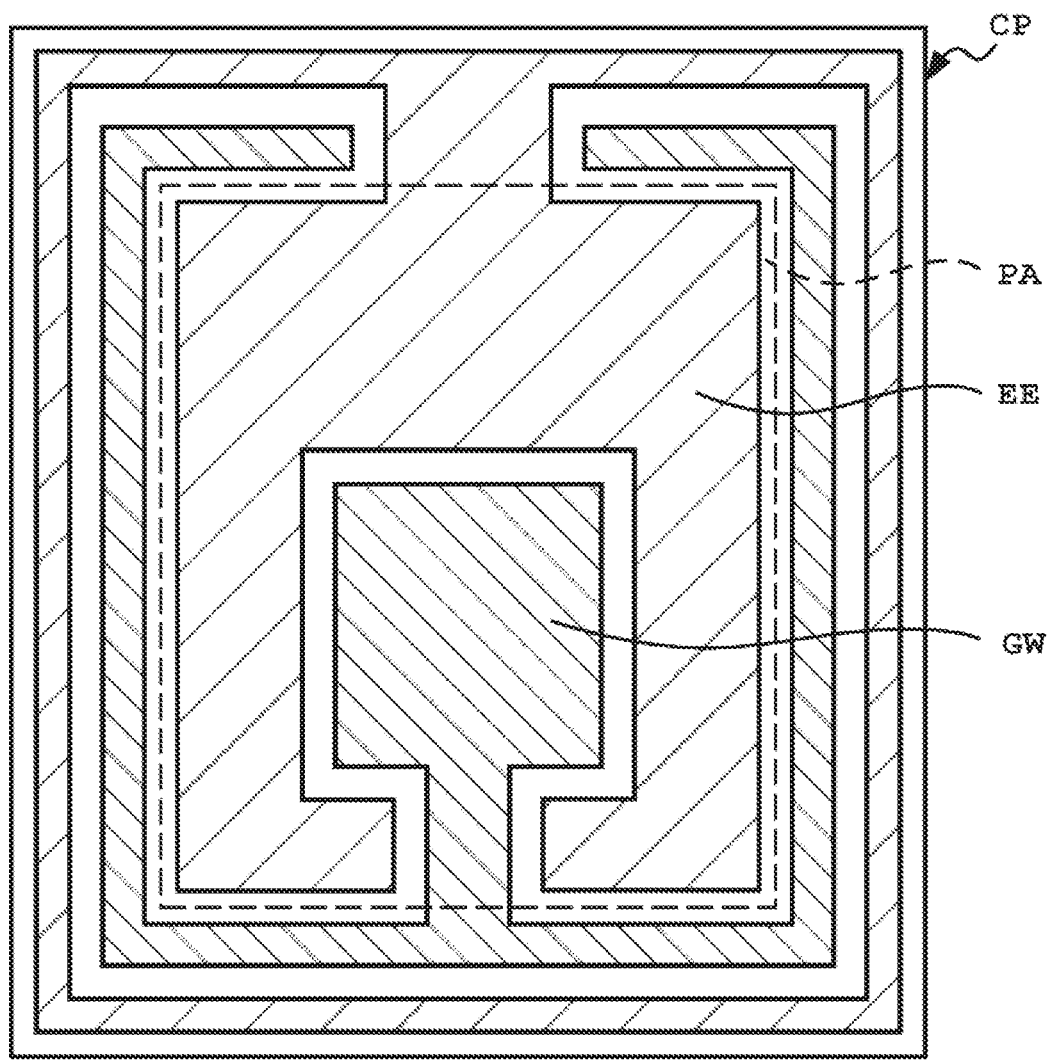
FIG. 1 is a plan view illustrating a layout of a semiconductor chip which is a semiconductor device according to a first embodiment.

Hereinafter, the semiconductor device according to embodiments will be described in detail by referring to the drawings. In the specification and the drawings, the same or corresponding form elements are denoted by the same reference numerals, and a repetitive description thereof is omitted. Further, at least a part of each embodiment and each modification may be arbitrarily combined with each other.

First Embodiment

Structure of a Semiconductor Device of a First Embodiment

An exemplary semiconductor device according to a first embodiment will be described. First, an entire configuration of the semiconductor device will be described. The semiconductor device according to the first embodiment, for example, the IGBT using SiC.

FIG. 1 is a plan view illustrating a layout of a semiconductor chip CP which is the semiconductor device of the first embodiment. In FIG. 1, in order to easy understanding, a protective film PS (see FIG. 3) is shown in as transparent, and although it is a plan view, a gate wiring GW and an emitter electrode EE are hatched.

As shown in FIG. 1, a surface of the semiconductor chip CP is mainly covered with the emitter electrode EE and the gate wiring GW. A part of the gate wiring GW is formed so as to surround a part of the emitter electrode EE formed near a center of the semiconductor chip CP. Further, a portion of the emitter electrode EE is formed so as to surround a portion of the gate wiring GW. In a pad area PA formed near the center of the semiconductor chip CP, a portion of the protective film PS has been removed, the portion of the emitter electrode EE and the portion of the gate wiring GW is exposed. External connection terminals such as wire bonding or clips (copper plates) are connected to the exposed emitter electrode EE and the gate wiring GW, respectively, that the semiconductor chip CP is electrically connected to other chip or wiring substrate or the like.

Figure 2:
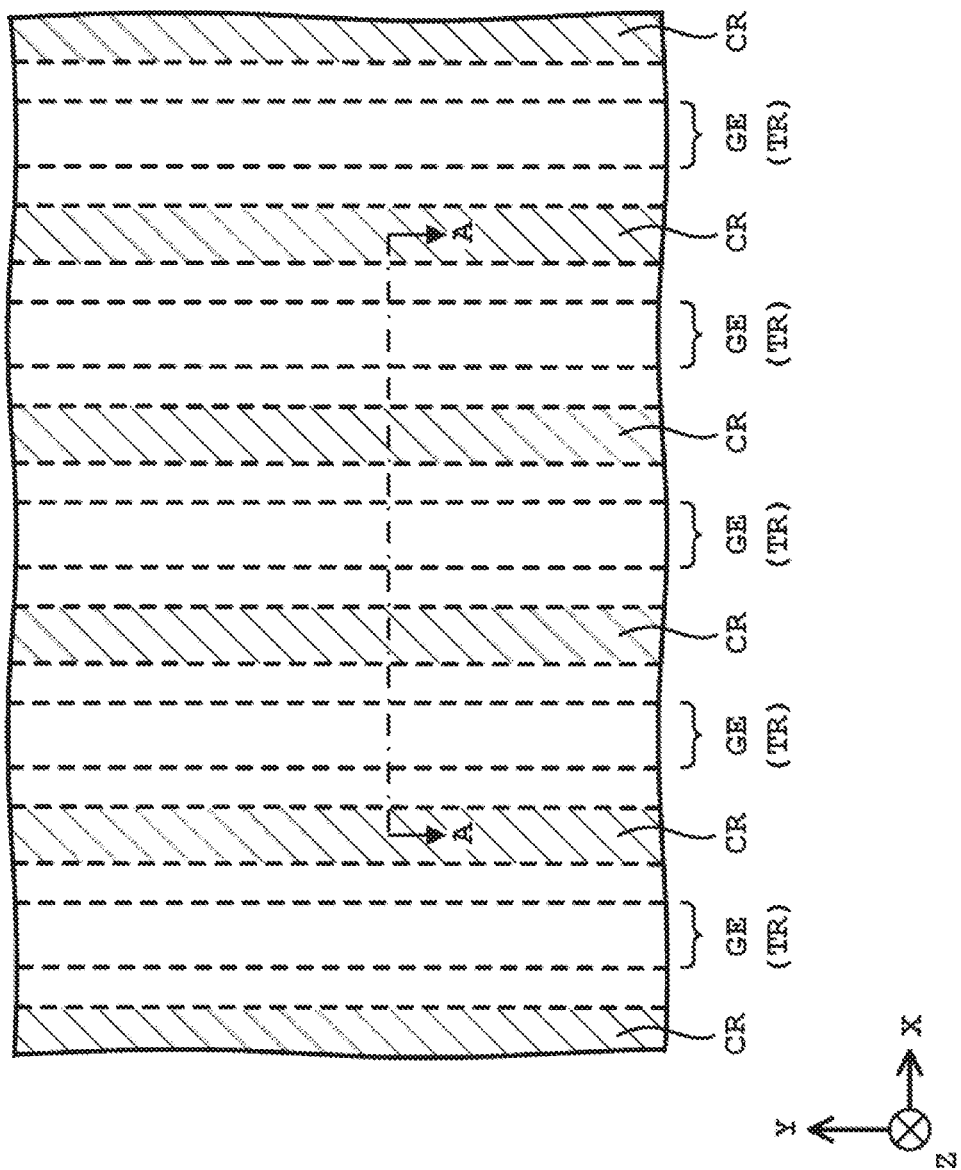
FIG. 2 is a plan view of main portion of the semiconductor device according to the first embodiment.

FIG. 2 is a plan view of main portion the semiconductor chip CP and corresponds to a portion of plan view under the emitter electrode EE in the pad area PA shown in FIG. 1.

FIG. 2 shows only a gate electrode GE and a collector region CR formed in a trench TR in configurations of the first embodiment, and other configurations are omitted. And, although FIG. 2 is a plan view, a collector region CR is hatched to make the drawing easier to see.

As shown in FIG. 2, the trench TR, the gate electrode GE and the collector region CR extend in a first direction (Y direction), respectively. That is, a planar shape of each of the trench TR, the gate electrode GE and the collector region CR are rectangular shape having long sides in the first direction (Y direction) respectively. And lengths in the first direction (Y direction) are longer than lengths in a second direction (X direction) respectively, which is the direction intersecting with the first direction (Y direction). Further, the trench TR, the gate electrode GE and the collector region CR are repeatedly arranged in the second direction (X direction). Further, the two collector regions CR adjacent to each other in the second direction (X direction), in a cross section perpendicular to the first direction (Y direction), when drawing a central line in a thickness direction (Z direction) from a center of the gate electrode GE, they are arranged symmetrically with respect to the central line.

Figure 3:
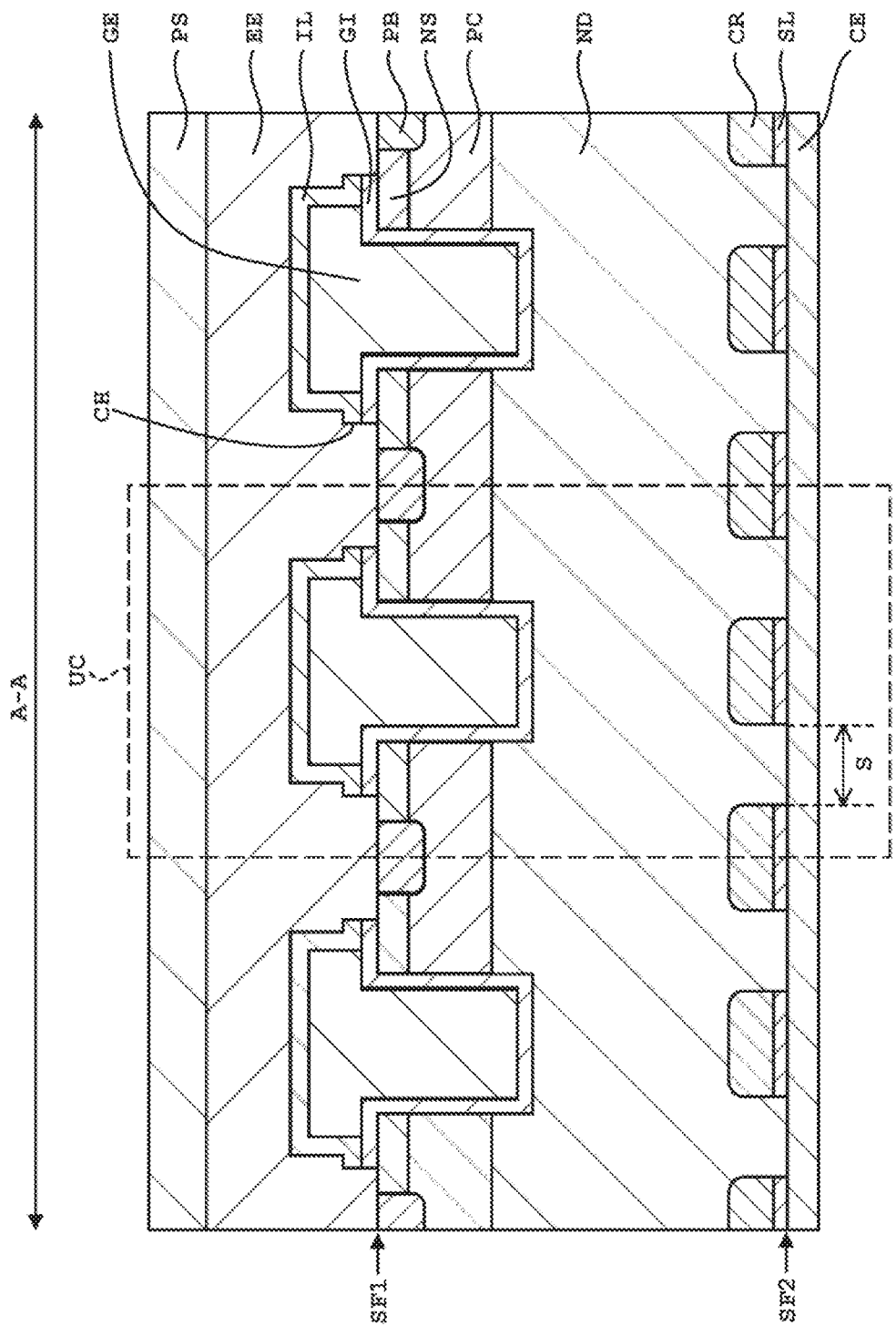
FIG. 3 shows a main portion cross-sectional view of the semiconductor device according to the first embodiment.

Next, a cross-sectional structure of the semiconductor device according to the first embodiment will be described with reference to FIG. 3. FIG. 3 is a main portion cross-sectional view along line A-A in FIG. 2.

A drift layer ND is a semiconductor layer including silicon and carbon. The drift layer ND is, for example, an n-type semiconductor layer and is a semiconductor layer formed by epitaxial method on a semiconductor substrate SB (not shown) which is a SiC substrate. The drift layer ND has an upper surface (first main surface SF1) and a bottom surface (second main surface SF2) of the drift layer ND which is a surface opposite to the upper surface (first main surface SF1).

A channel region (impurity region) PC is formed on the drift layer ND. The channel region PC is, for example, a p-type semiconductor region, and is an impurity region formed in the drift layer ND by ion implantation method.

An emitter region (impurity region) NS and a body region (impurity region) PB are formed so as to be in contact with the channel region PC. The emitter region NS is, for example, a semiconductor region of n-type, the body region PB is, for example, a semiconductor region of p-type. An impurity concentration of the emitter region NS is higher than an impurity concentration of the drift layer ND.

The emitter region NS and the body region PB are electrically connected to the emitter electrode EE respectively, and an emitter potential is applied during an operation of the power transistor via the emitter electrode EE. The body region PB is a region provided for a purpose of reducing a contact resistance when the emitter electrode EE is connected to the channel region PC. Therefore, an impurity concentration of the body region PB is higher than that of the channel region PC The trench TR is formed on the first main surface SF1 of the drift layer ND. The trench TR is formed such that penetrating the emitter region NS and the channel region PC and reach the drift layer ND. That is, a bottom of the trench TR is located in the drift layer ND. Further, the trench TR is formed such that being positioned between the two emitter regions NS.

Inside the trench TR, the gate electrode GE is embedded via a gate insulating film GI formed on an inner surface of the trench TR. The gate electrode GE is electrically connected to the gate wiring GW (see FIG. 1) and a gate potential is applied during the operation of the power transistor. The gate insulating film GI is, for example, a silicon oxide film, the gate electrode GE is, for example, a polycrystalline silicon film introducing n-type impurities. As the gate insulating film GI, instead of the silicon oxide film, so-called a high dielectric constant gate dielectric film having a dielectric constant higher than that of the silicon oxide film may be used, such as an aluminum oxide film or a hafnium oxide film.

A portion of the gate insulating film GI is formed on the emitter region NS. Next, an interlayer insulating film IL made of, for example, silicon oxide is formed on a part of the gate insulating film GI and an upper surface of each of the gate electrode GE. Next, in the interlayer insulating film IL, a contact hole CH is formed. The contact hole CH is formed such that penetrating the interlayer insulating film IL and the gate insulating film GI and reach the emitter region NS and the body region PB.

On the interlayer insulating film IL, the emitter electrode EE is formed, the emitter electrode EE is embedded in the contact hole CH. That is, the emitter electrode BE is electrically connected to the emitter region NS and the body region PB. The emitter electrode EE is made of, for example, conductive film mainly made of aluminum. The emitter electrode EE may be, for example, a laminated film of a barrier metal film made of titanium nitride and conductive film mainly made of aluminum.

On the emitter electrode EE, for example, the protective film PS made of resin such as polyimide is formed. Although not shown in FIG. 3, in the pad area PA shown in FIG. 1, an opening is provided in the protective film PS so as to expose a part of the emitter electrode EE and a part of the gate wiring GW.

On the second main surface SF2 side of the drift layer ND, in a direction (second direction, X direction in FIG. 2) intersecting with a direction in which the trench TR extends (first direction, Y direction in FIG. 2), a plurality of collector regions CR are formed at a predetermined interval S. That is, in plan view, the plurality of collector regions CR are formed so as to be embedded in the drift layer ND at the predetermined interval S in a direction intersecting the direction in which the trench TR extends. In other words, the plurality of collector regions CR are formed to be separated from each other by the predetermined interval S. As will be described in detail later, the predetermined interval S can be freely selected.

The collector region CR is, for example, a p-type semiconductor region. An impurity concentration of the collector region CR is, for example, $1 \times 10^{18}$ cm$^{-3}$ or more and $3 \times 10^{18}$ cm$^{-3}$ or less, preferably $1.5 \times 10^{18}$ cm$^{-3}$ or more and $2.5 \times 10^{18}$ cm$^{-3}$ or less. By setting a impurity concentration of the collector region CR in above range, ohmic contact (junction) with a collector electrode CE described later becomes good.

Further, a plurality of pn-junctions are formed by contacting with the drift layer ND and the plurality of collector regions CR. A pnp bipolar transistor formed by adding the channel region PC to the pn-junction constitutes a part of the IGBT.

The collector electrode CE made of metal film is formed so as to cover the drift layer ND and the collector region CR. The collector electrode CE is made of, for example, conductive film mainly made of aluminum. The collector electrode CE may be, for example, a laminated film of a harrier metal film made of titanium nitride and conductive film mainly made of aluminum. A collector potential is applied to the collector electrode CE during the operation of the power transistor.

A silicide layer SL is formed between the collector region CR and the collector electrode CE. The silicide layer SL is made of, for example, nickel silicide (NiSi), titanium silicide (TiSi2) or cobalt silicide (CoSi2). As a result, the collector region CR and the collector electrode CE are in ohmic contact (junction).

On the other hand, the silicide layer SL is not formed at a portion where the drift layer ND and the collector electrode CE are contacted. That is, the collector electrode CE is directly formed on the second main surface SF2 of the drift layer ND. Therefore, in a case of the first embodiment, the drift layer ND and the collector electrode CE are not in ohmic contact (junction) but in Schottky contact (junction). Thus, a Schottky barrier diode SBD is formed on a junction surface between the drift layer ND and the collector electrode CE.

From the above, in the semiconductor device of the first embodiment, on the second main surface SF2 side of the drift layer ND, both the drift layer ND and the collector region CR via the silicide layer SL are connected to the collector electrode CE.

Note that, in FIG. 3, an area surrounded by a broken line indicates a unit cell UC. In the first embodiment, the unit cell UC includes one gate electrode GE, emitter regions NS and body regions PB on both sides of the one gate electrode GE, the channel region PC, the drift layer ND, and a plurality of the collector regions CR. In the first embodiment, the unit cell UC is defined as an area from a center of the body region PB formed on one side surface side of the gate electrode GE to an center of the body region PB formed on another side surface side of the gate electrode GE. A plurality of unit cells UC are repeatedly arranged in the semiconductor chip CP.

Manufacturing Method of the Semiconductor Device of the First Embodiment

A manufacturing method of the semiconductor device of the first embodiment will be described below with reference to FIGS. 4 to 15. In FIGS. 4 to 15, for simplification of description, only a region corresponding to the unit cell UC in FIG. 3 is shown.

Figure 4:
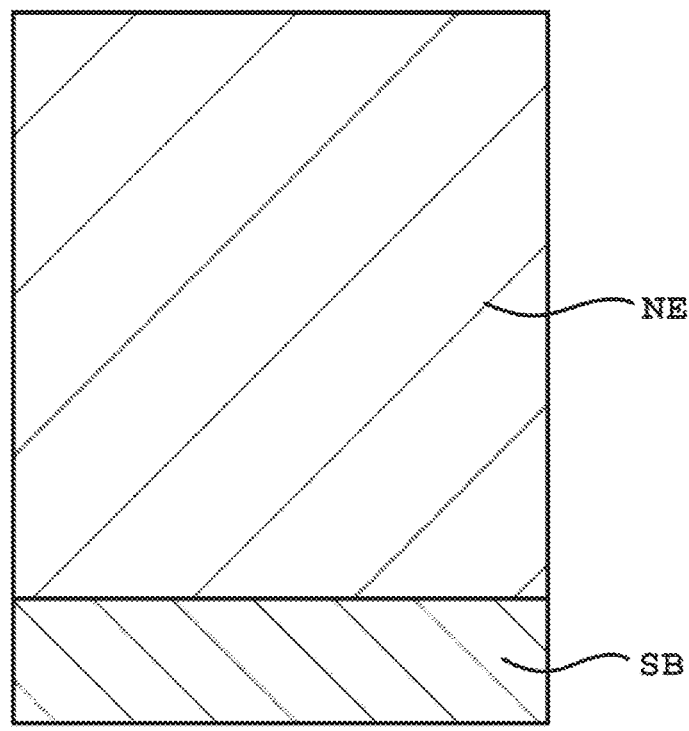
FIG. 4 is a cross-sectional view during a manufacturing process of the semiconductor device according to the first embodiment.

First, as shown in FIG. 4, the semiconductor substrate SB made of SiC on which an epitaxial layer NE is formed is prepared. The epitaxial layer NE is a semiconductor layer made of SiC, for example, n-type semiconductor layer which a n-type impurity is introduced. Here, the epitaxial layer NE have impurity concentration of, for example, about $8 \times 10^{15}$ cm$^{-3}$ and have a thickness of about 12 μm. The epitaxial layer NE is formed on the upper surface of the semiconductor substrate SB by performing epitaxial growth while introducing n-type impurities.

Figure 5:
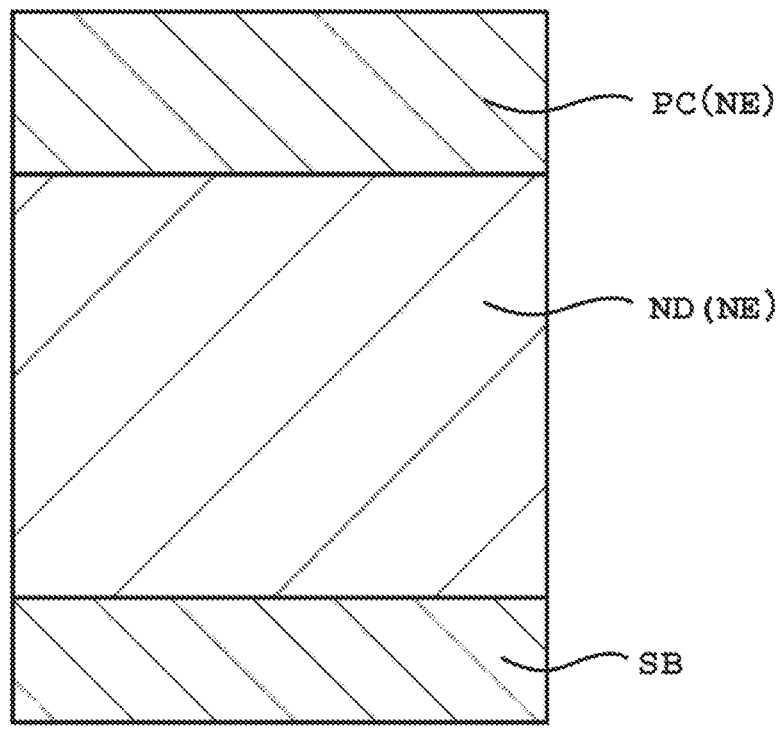
FIG. 5 is a cross-sectional view during the manufacturing process of the semiconductor device according to the first embodiment following FIG. 4.

Next, as shown in FIG. 5, the channel region PC is formed on the epitaxial layer NE. The channel region PC is a p-type semiconductor region into which a p-type impurity has been introduced, and is formed by, for example, implanting aluminum (Al) ions. Here, the channel region PC has a peak impurity concentration of, for example, about $3 \times 10^{17}$ cm$^{-3}$, and the channel region PC has a thickness, for example, of about 0.8 μm, (thickness in the depth direction with reference to the first main surface SF1 in FIG. 3). Further, among the epitaxial layer NE, the region other than the channel region PC becomes the drift layer ND.

Figure 6:
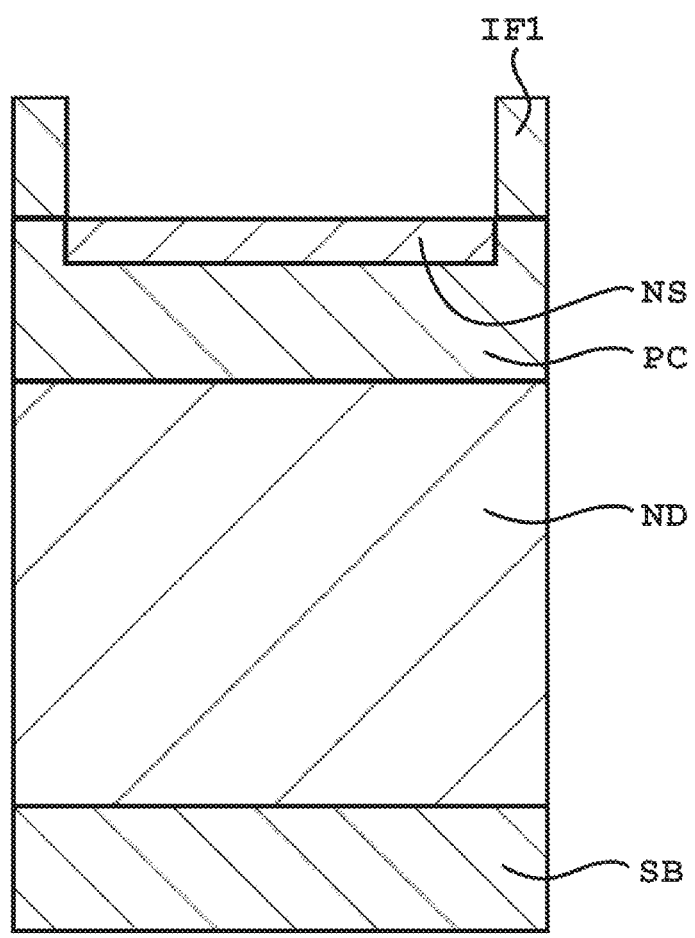
FIG. 6 is a cross-sectional view during the manufacturing process of the semiconductor device according to the first embodiment following FIG. 5.

Next, as shown in FIG. 6, the emitter region NS is formed so as to be in contact with an upper portion of the channel region PC. The emitter region NS is an n-type semiconductor region in which n-type impurities are introduced. First, an insulating film IF1 made of, for example, silicon oxide is formed on the channel region PC by, for example, CVD method. Next, the insulating film IF1 is patterned by photolithography and etching process. Next, using the patterned insulating film IF1 as a mask, ion implantation using nitrogen (N) ions is performed to selectively form the emitter region NS in the channel region PC. Here, the emitter region NS has an impurity concentration higher than the impurity concentration of the drift layer ND, for example, the emitter region NS has a peak impurity concentration of about $2 \times 10^{20}$ cm$^{-3}$, and has a thickness of about 0.3 μm (thickness in the depth direction with reference to the first main surface SF1 in FIG. 3). Thereafter, an insulating film IF2 is removed by, for example, wet etching process using a solution containing hydrofluoric acid.

Figure 7:
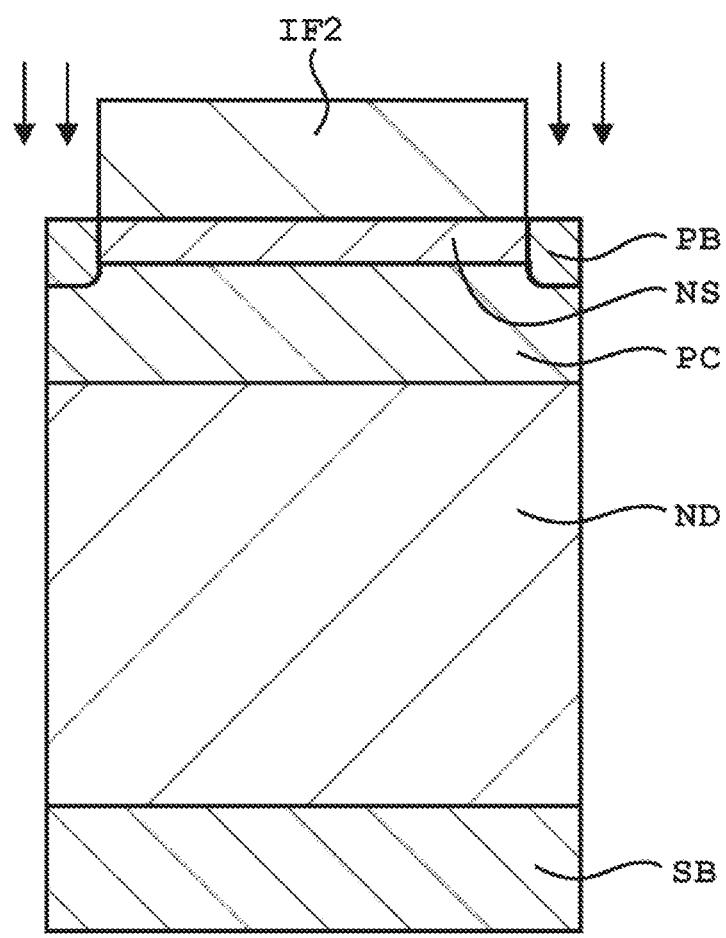
FIG. 7 is a cross-sectional view during the manufacturing process of the semiconductor device according to the first embodiment following FIG. 6.

Next, as shown in FIG. 7, the body region PB is formed so as to be adjacent to the emitter region NS. The body region PB is a p-type semiconductor region into which a p-type impurity is introduced. First, the insulating film IF2 made of, for example, silicon oxide is formed on the emitter region NS by, for example, CVD method. Next, the insulating film IF2 is patterned by photolithography and etching process, Next, using the patterned insulating film IF2 as a mask, by performing ion implantation using aluminum (Al) ions, to form the body region PB adjacent to the emitter region NS and reaching the channel region PC. Here, the body region PB has, for example, a peak level of about $2 \times 10^{20}$ cm$^{-3}$. Thereafter, the insulating film IF2 is removed by, for example, wet etching process using a solution containing hydrofluoric acid. Thereafter, heat treatment (annealing treatment) is performed to activate the implanted impurities. As a temperature of this heat treatment, for example, 1700° C. can be applied.

Figure 8:
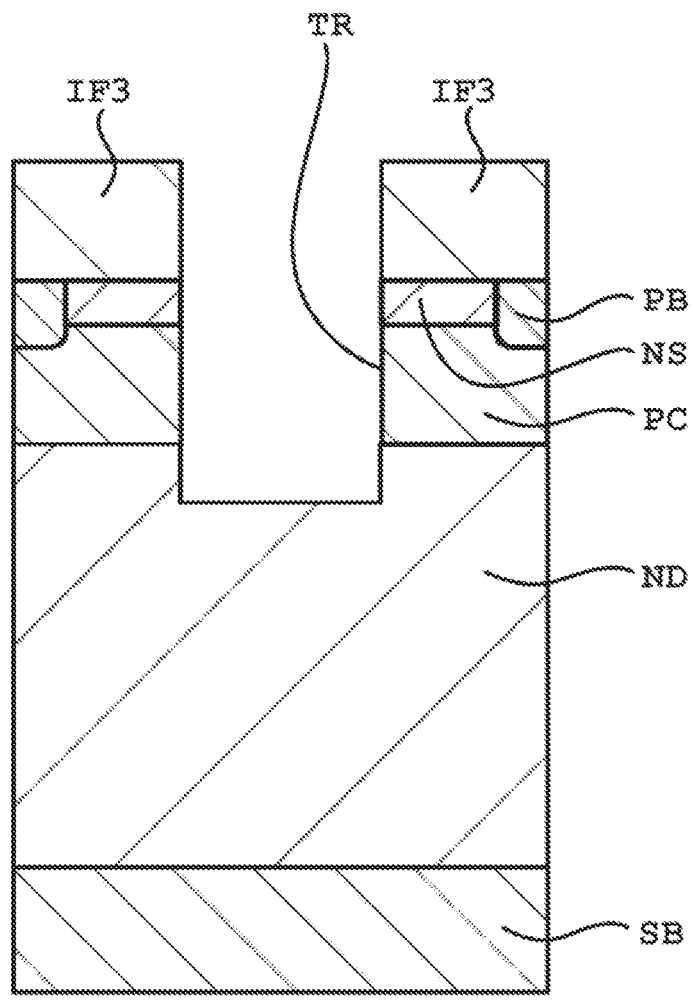
FIG. 8 is a cross-sectional view during the manufacturing process of the semiconductor device according to the first embodiment following FIG. 7.

Next, as shown in FIG. 8, the trench TR is formed. First, an insulating film IF3 made of, for example, silicon oxide is formed on the emitter region NS and the body region PB by, for example, CVD method. The insulating film IF3 is patterned by photolithography and etching process. Next, using the patterned insulating film IF3 as a mask, by performing dry etching process, penetrating the emitter region NS and the channel region PC, to form the trench TR reaching the drift layer ND. A width of the trench TR (width in the X direction in FIG. 2) is about 1.0 μm, a depth of the groove TR (depth with reference to the first main surface SF1 in FIG. 3) is about 1.2 μm. Note that, this dry etching process is performed using gases composed of molecules containing fluorine such as CF4 or SF6. Thereafter, the insulating film IF3 is removed by, for example, wet etching process using a solution containing hydrofluoric acid.

Figure 9:
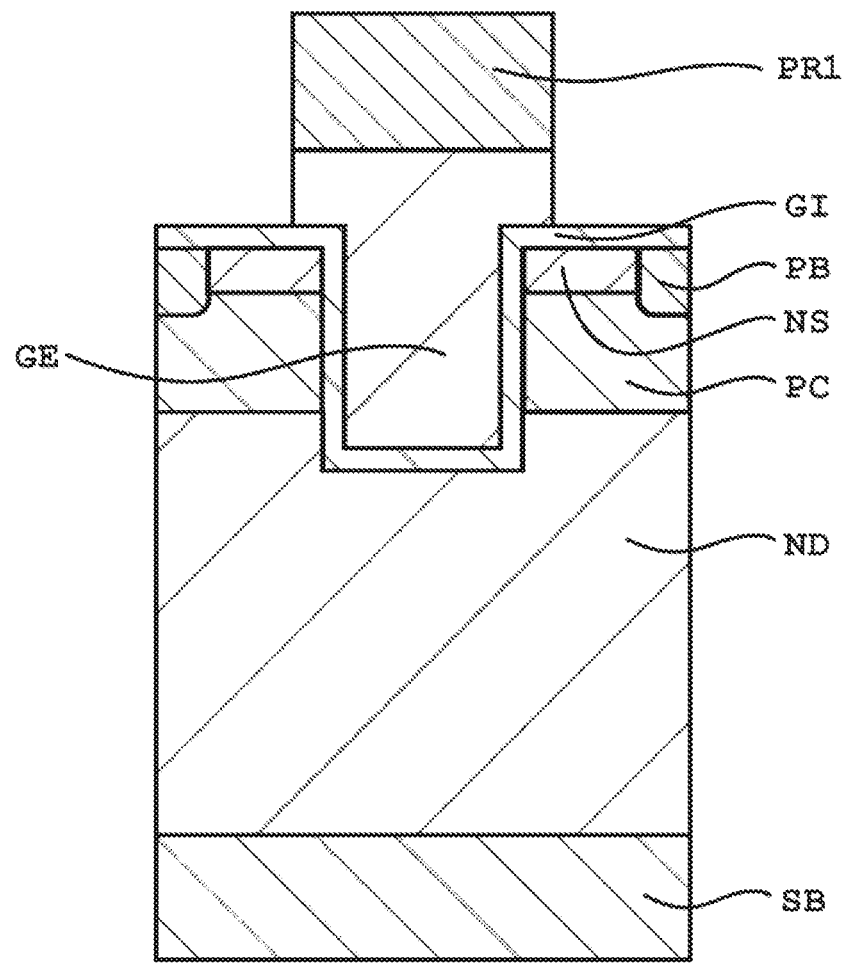
FIG. 9 is a cross-sectional view during the manufacturing process of the semiconductor device according to the first embodiment following FIG. 8.

Next, as shown in FIG. 9, the gate insulating film GI and the gate electrode GE are formed, First, the gate insulating film GI made of, for example, silicon oxide is formed on the inner surface of the trench TR, the emitter region NS, and the body region PB by, for example, CVD method, thermal oxidation method, or combination thereof. A thickness of the gate insulating film GI is, for example, 50 nm to 100 nm. As the gate insulating film GI, instead of the silicon oxide film, so-called the high dielectric constant gate dielectric film having a dielectric constant higher than that of the silicon oxide film, such as an aluminum oxide film or a hafnium oxide film, may be used. Next, a conductive film made of, for example, polycrystalline silicon is formed on the gate insulating film GI, for example, by CVD method, so as to embed an inside of the trench TR. Next, a resist pattern RP1 covering a part of the conductive film is formed on the conductive film. Next, using the resist pattern RP1 as a mask, dry etching process is performed to remove the conductive film exposed from the resist pattern RP1. Thus, the gate electrode GE made of a remaining conductive film is formed. Thereafter, the resist pattern RP1 is removed by ashing or the like.

Figure 10:
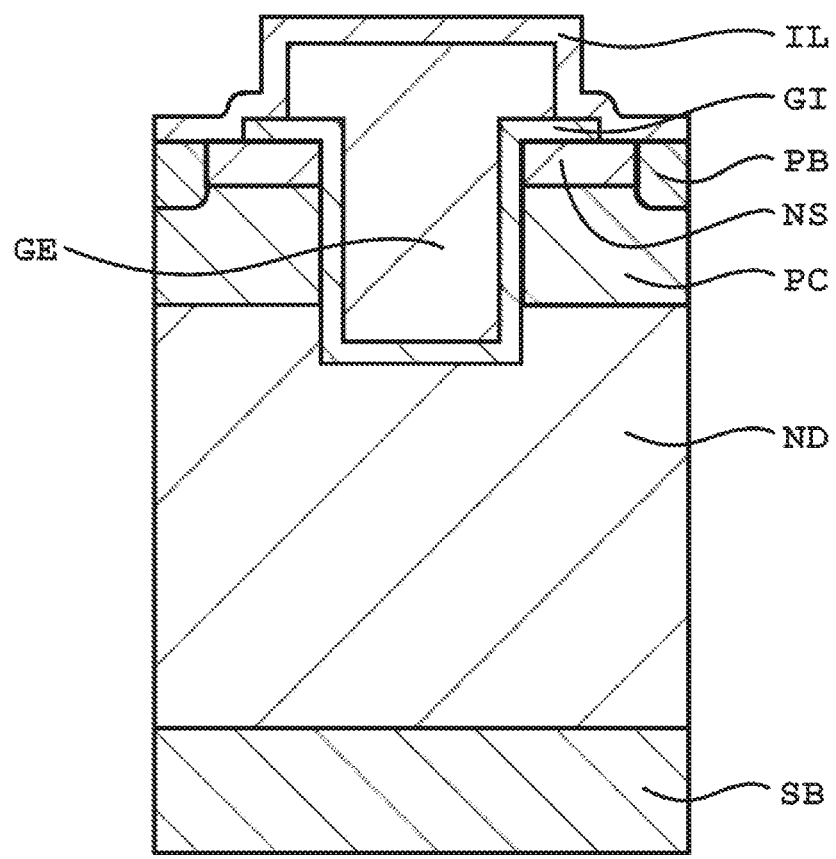
FIG. 10 is a cross-sectional view during the manufacturing process of the semiconductor device according to the first embodiment following FIG. 9.

Next, as shown in FIG. 10, the interlayer insulating film IL is formed. The interlayer insulating film IL made of, for example, silicon oxide is formed on the gate insulating film GI by, for example, CVD method so as to cover the side surface and the upper surface of the gate electrode GE formed outside the trench TR. When the interlayer insulating film IL is silicon oxide, a thickness of the interlayer insulating film IL is, for example, 2 to 3 μm. The interlayer insulating film IL is not limited to a silicon oxide film and may be formed of another insulating film such as a silicon nitride film or a silicon oxynitride film.

Figure 11:
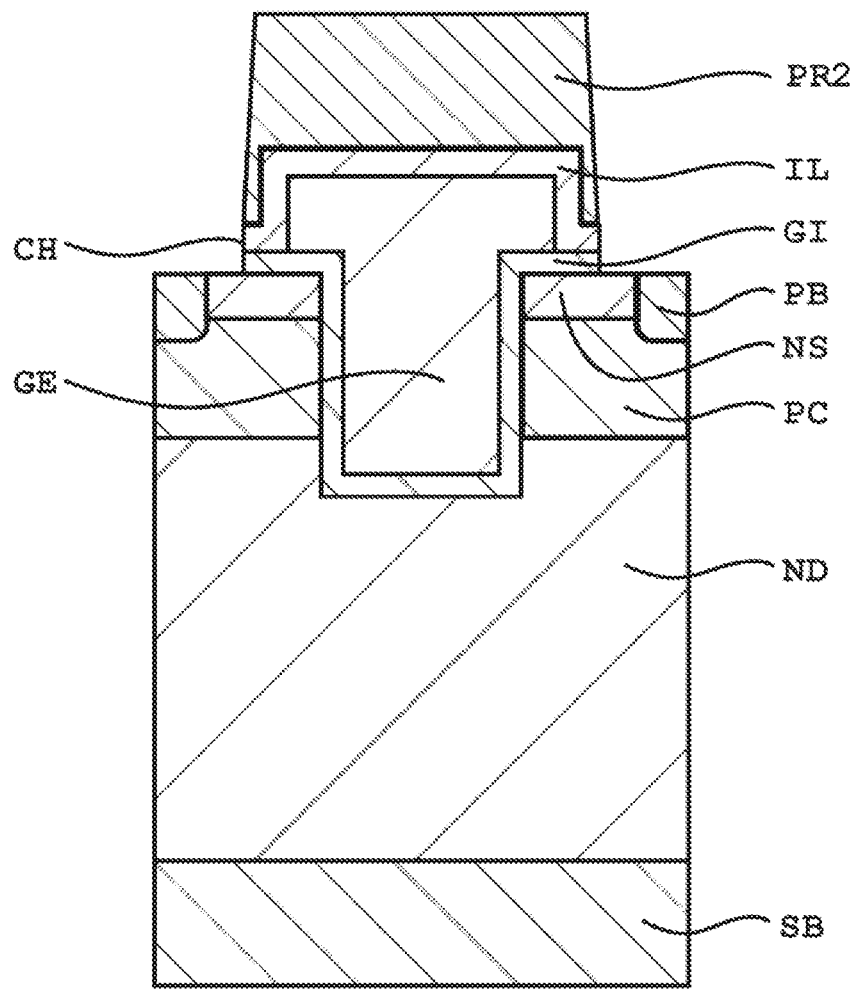
FIG. 11 is a cross-sectional view during the manufacturing process of the semiconductor device according to the first embodiment following FIG. 10.

Next, as shown in FIG. 11, the contact hole CH is formed. First, a resist pattern RP2 that covers a part of the interlayer insulating film IL and has a width wider than a width of the gate electrode GE outside the trench TR is formed on the interlayer insulating film IL. Next, using the resist pattern RP2 as a mask, by performing dry etching process, the interlayer insulating film IL and the gate insulating film GI is removed. Thus, a part of the emitter region NS and the contact hole CH reaching the body region PB is formed so as to penetrate the interlayer insulating film IL and the gate insulating film GI. Thereafter, the resist pattern RP2 is removed by ashing or the like. Although not shown in the first embodiment, a silicide layer may be formed on an upper surface of part of the emitter region NS and the body region PB after a step of forming the contact hole CH.

Figure 12:
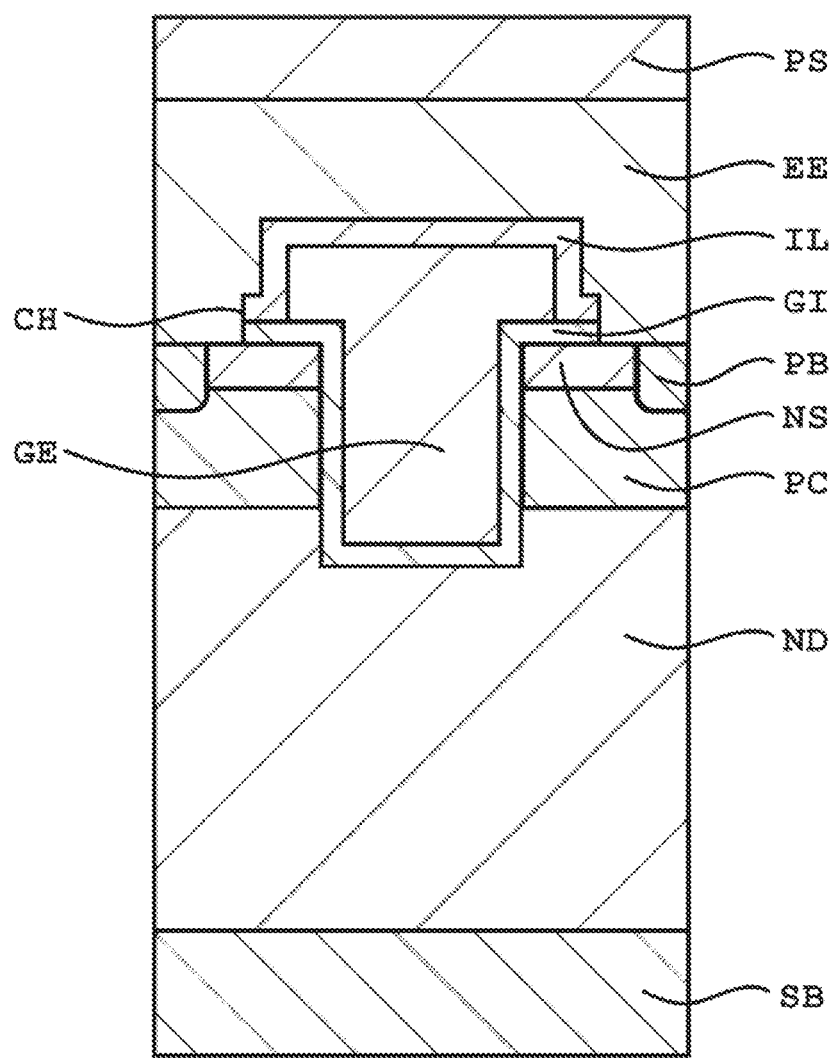
FIG. 12 is a cross-sectional view during the manufacturing process of the semiconductor device according to the first embodiment following FIG. 11.

Next, as shown in FIG. 12, the emitter electrode EE and the protective film PS are formed. First, a conductive film mainly composed of aluminum is formed on the interlayer insulating film IL so as to embed the inside of the contact hole CH, for example, by sputtering method. The conductive film mainly composed of aluminum, for example, aluminum (Al), alloy of silicon and aluminum (AlSi), or alloy of silicon and copper (AlCu) can be applied. By patterning the conductive film by photolithography and etching process, the emitter electrode EE electrically connected to the emitter region NS and the body region PB is formed. In addition, before for the conductive film, for example, a barrier metal film made of titanium nitride may be formed, and the emitter electrode EE may be a laminated film of the barrier metal film and a conductive film. Although not shown here, the gate wiring GW shown in FIG. 1 is also formed similarly to the emitter electrode EE, and the gate wiring GW is electrically connected to the gate electrode GE. Next, the protective film PS made of, for example, resin such as polyimide is formed on the emitter electrode EE using, for example, coating method. Thereafter, although not shown here, in the pad area PA shown in FIG. 1, the opening is formed in the protective film PS so as to expose a part of the emitter electrode EE and a part of the gate wiring GW.

Figure 13:
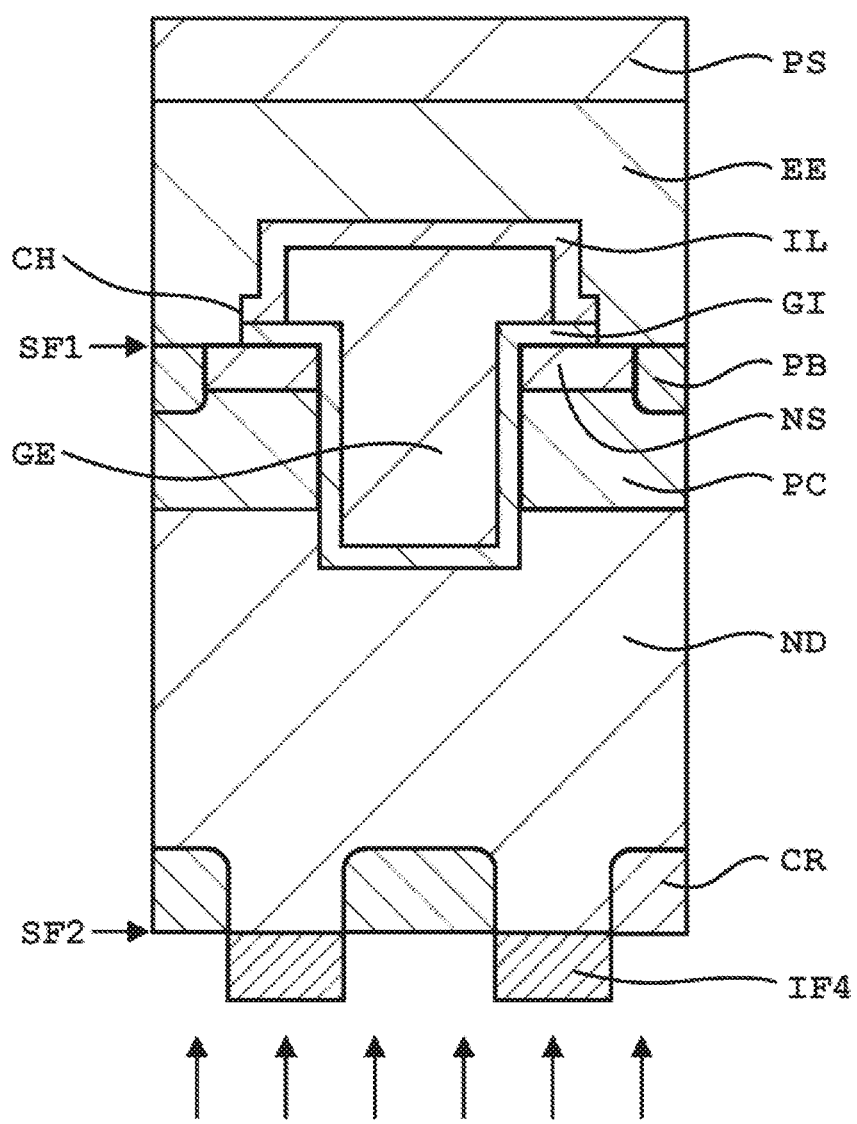
FIG. 13 is a cross-sectional view during the manufacturing process of semiconductor device according to the first embodiment following FIG. 12.

Next, as shown in FIG. 13, the plurality of collector regions CR are formed on the second main surface SF2 side of the drift layer ND. First, polishing process is performed on a bottom surface of the semiconductor substrate SB, to remove the semiconductor substrate SB so as to expose the second main surface SF2 of the drift layer ND. Next, an insulating film IF4 made of, for example, silicon oxide is formed on the second main surface SF2 of the drift layer ND by, for example, CVD method. Next, the insulating film IF4 is patterned by photolithography and etching process. At this time, the insulating film IF4 is patterned at the predetermined interval S in the direction (first direction, Y direction in FIG. 2) intersecting the direction in which the gate electrode GE extends (second direction, X direction in FIG. 2). Next, using the patterned insulating film IF4 as a mask, ion implantation using aluminum (Al) ions is performed to selectively form the plurality of collector regions CR on the second main surface SF2 side of the drift layer ND. The collector region CR has a peak impurity concentration of, for example, about $2\times10^{13}$ cm$^{-3}$, and the collector region CR has a thickness of about 2.0 µm (thickness in the depth direction with reference to the second main surface SF2 in FIG. 3). Thereafter, heat treatment (laser annealing) is performed to activate the implanted impurities. As a temperature of this heat treatment, for example, 1700° C. can be applied.

Figure 14:
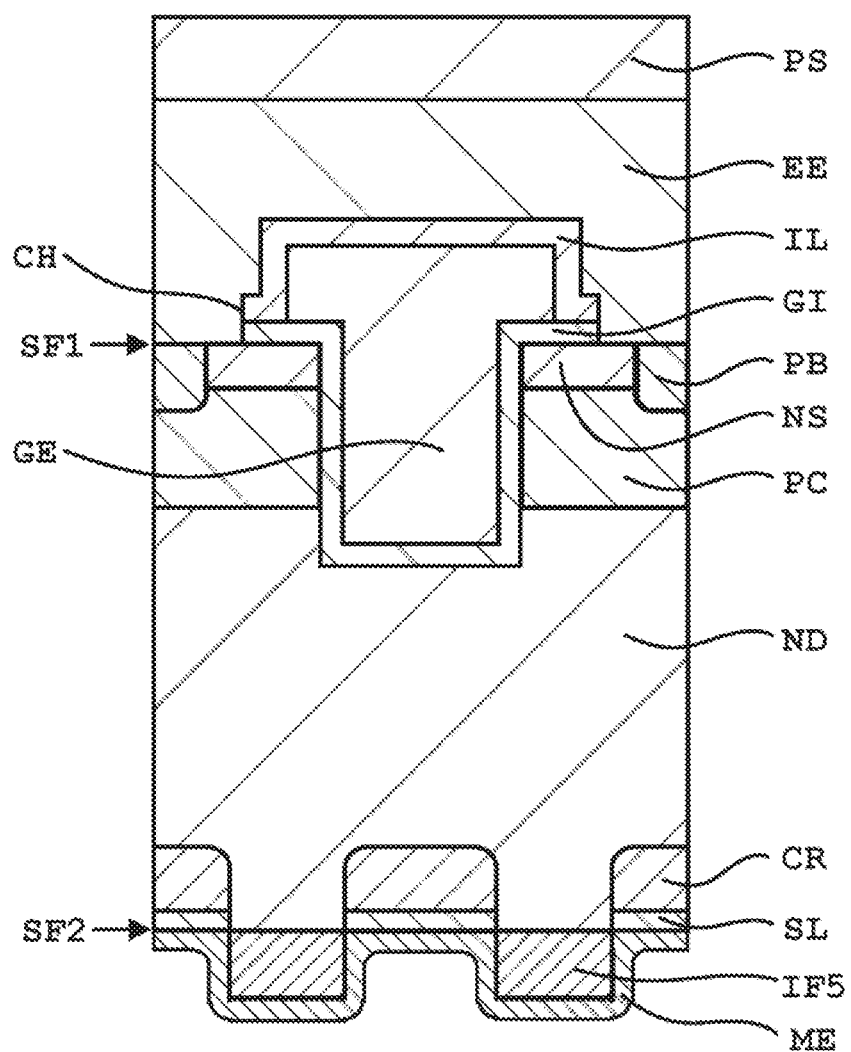
FIG. 14 is a cross-sectional view during the manufacturing process of the semiconductor device according to the first embodiment following FIG. 13.

Next, as shown in FIG. 14, silicide layer SL is formed on the second main surface SF2 sides of the collector region CR. First, a metal film ME for forming the silicide layer SL made of, for example, nickel (Ni), titanium (Ti), or cobalt (Co) is formed so as to cover the plurality of collector regions CR and an insulating film IF5. Next, by performing heat treatment to the metal film ME, a material forming part of the emitter region NS and the body region PB reacts with the metal film ME. As a result, the silicide layer SL made of nickel silicide (NiSi), titanium silicide (TiSi2) or cobalt silicide (CoSi2) is formed. As a temperature of this heat treatment, for example, 1000° C. can be applied. Thereafter, an unreacted metal film ME and the insulating film IF5 are removed by, for example, wet etching process.

Figure 15:
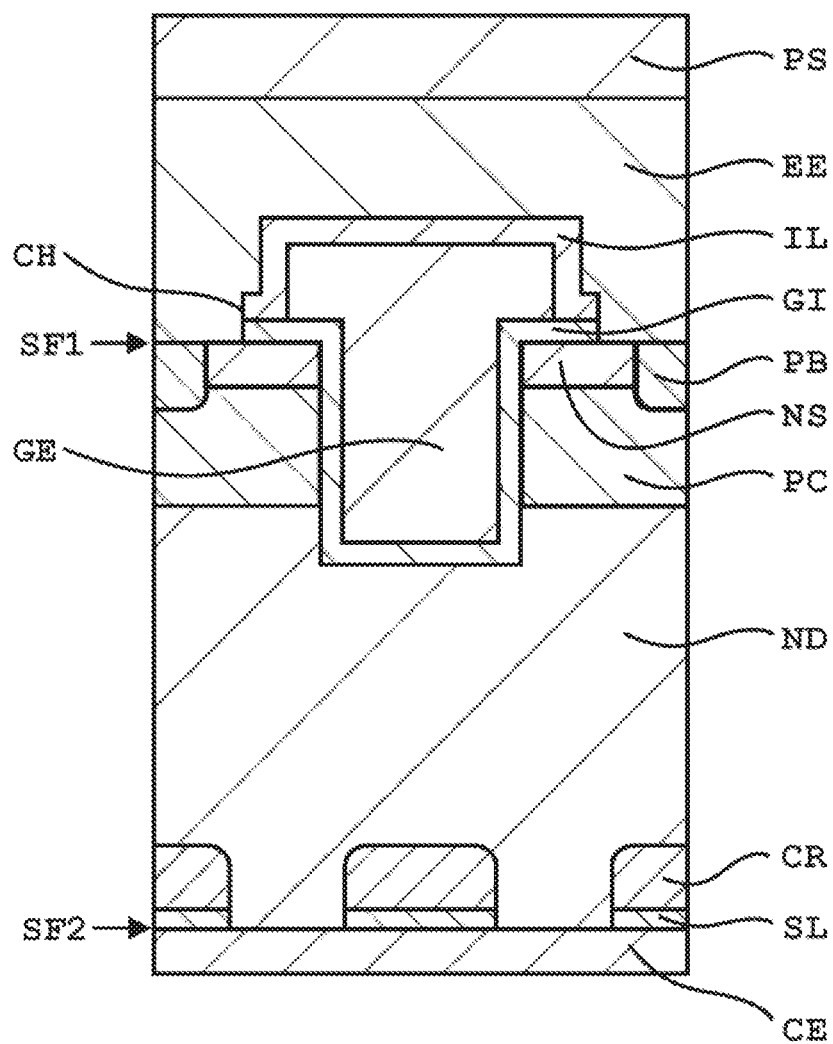
FIG. 15 is a cross-sectional view during the manufacturing process of the semiconductor device according to the first embodiment following FIG. 14.

Next, as shown in FIG. 15, the collector electrode CE made of laminated film, for example, nickel (Ni) layer and gold (Au) layer is formed on the second main surface SF2, for example, by sputtering method or CVD method. Here, a metal layer containing titanium (Ti) may be provided between the drift layer ND and the collector electrode CE. Since titanium (Ti) forms a lower Schottky barrier than nickel (Ni) and gold (Au), by providing a metal layer containing titanium (Ti) between the drift layer ND and the collector electrode CE, it is possible to reduce the loss of the Schottky barrier diode SBD formed by the drift layer ND and the collector electrode CE. As described above, the semiconductor device shown in FIG. 3 is manufactured.

A semiconductor device of an examined example will be described below.

Figure 16:
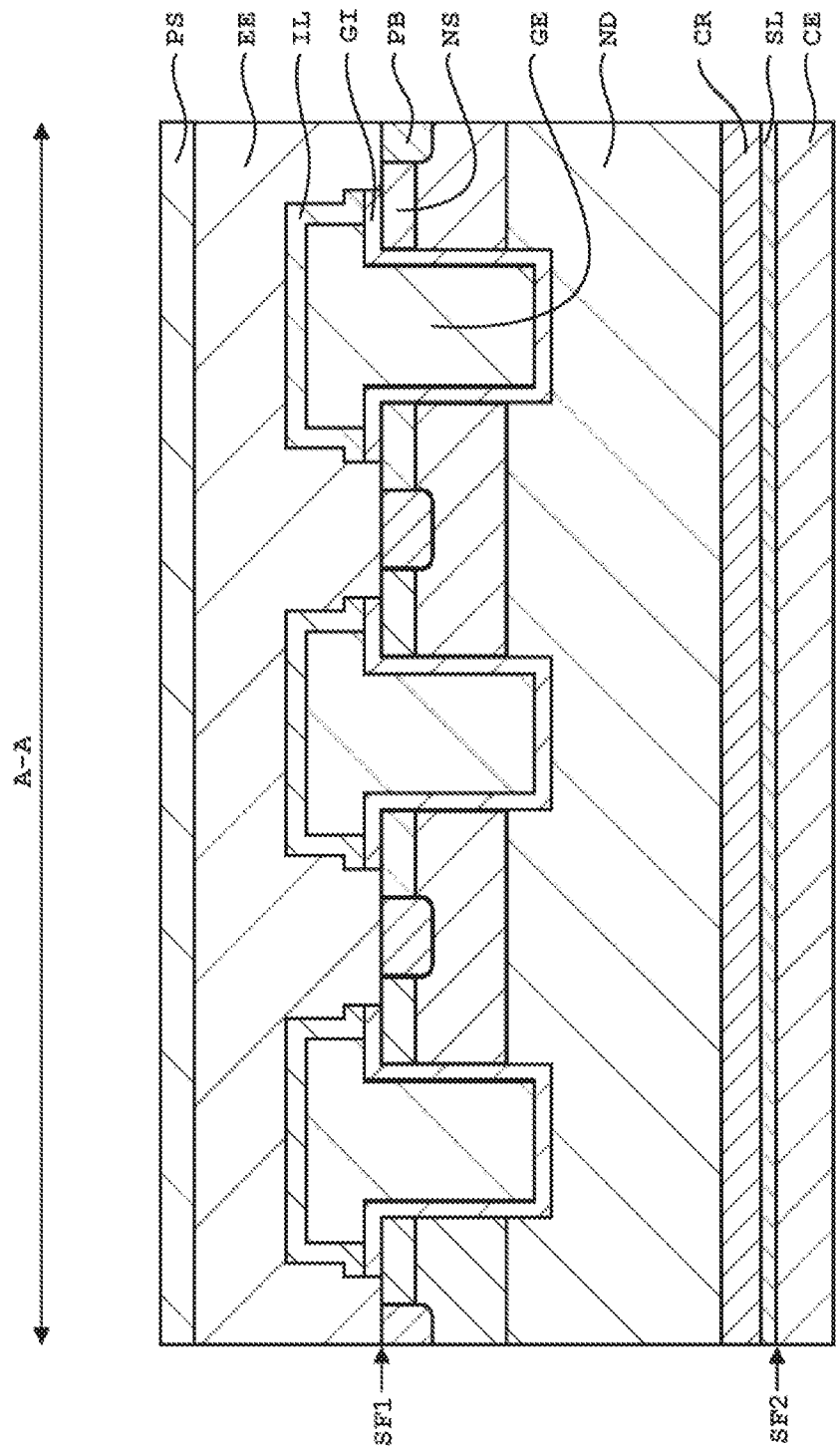
FIG. 16 shows a main portion cross-sectional view of a semiconductor device of an examined example.

FIG. 16 is main portion cross-sectional view of the semiconductor device of the examined example corresponding to cross-sectional view along line A-A in FIG. 2 at the first embodiment. The semiconductor device of the examined example is an IGBT structure power transistor made of SiC, same as in the first embodiment.

As shown in FIG. 16, in the examined example, the structure above the drift layer ND is similar to that of the first embodiment. However, it is different from the first embodiment in that the collector region CR is uniformly formed between the drift layer ND and the collector electrode CE. In other words, the plurality of collector regions CR are not formed at the predetermined interval S as in the first embodiment. Therefore, there is no portion where the drift layer ND and the collector electrode CE are directly bonded, and Schottky contact (junction) is not formed between the drift layer ND and the collector electrode CE.

Therefore, in the semiconductor device of the examined example, the pn-junction consisting of the drift layer ND and the collector region CR is uniformly formed with respect to the collector electrode CE.

Figure 17:
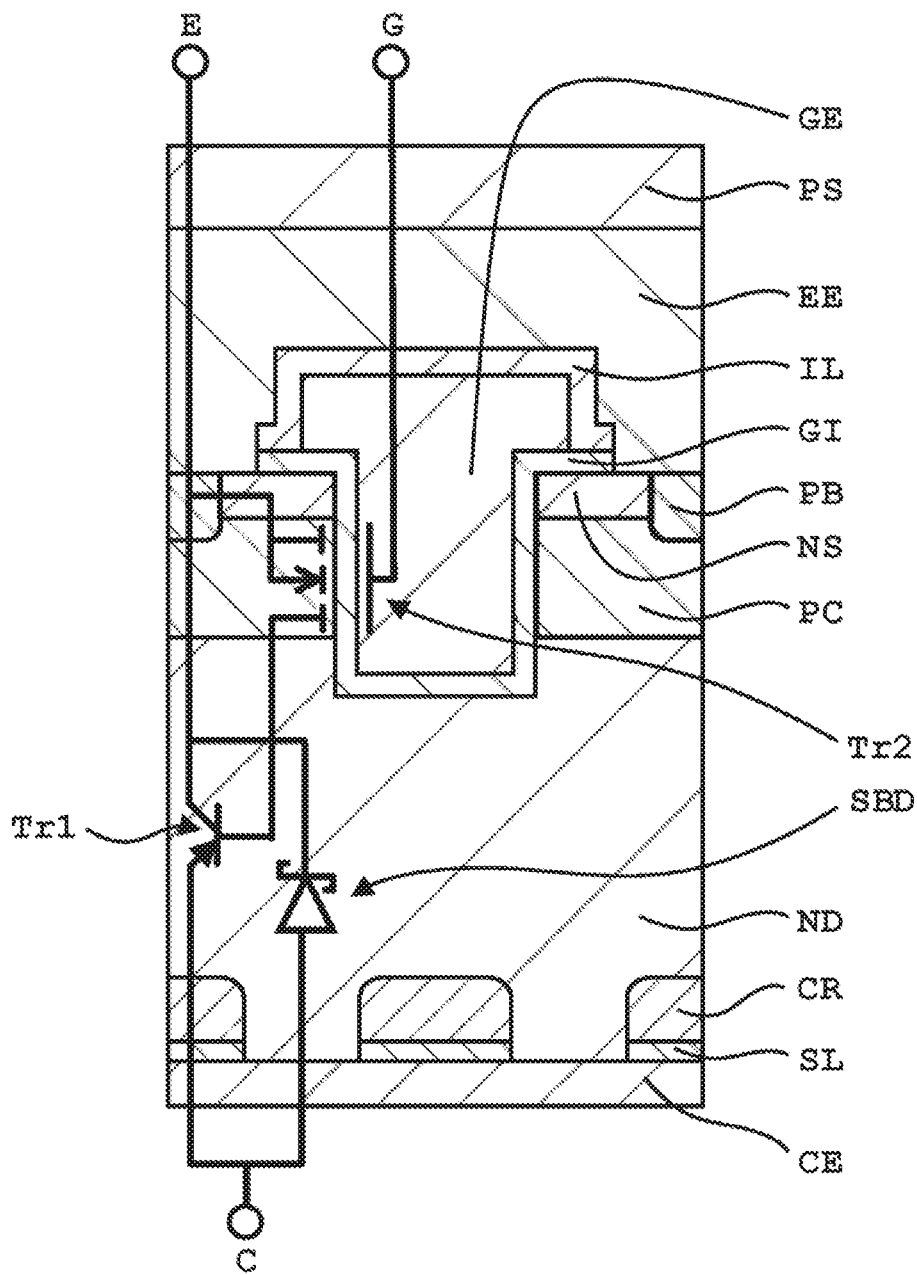
FIG. 17 is a diagram in which a schematic circuit diagram showing an operating principle of the semiconductor device according to the first embodiment is overlapped and shown on a schematic cross-sectional view of a main part.

Next, main features and effects of the first embodiment will be described. First, an operation of the IGBT of the first embodiment will be described with reference to FIG. 17.

In a state that a high potential (higher than the emitter potential) applied to the collector electrode CE of a collector C and a low potential (lower potential than the collector potential) applied to the emitter electrode EE of the emitter E, a voltage equal to or higher than an offset voltage is applied to the gate electrode GE of a gate G configuring a field effect transistor Tr2. Next, the field effect transistor Tr2 is turned on, and a base current of a pnp bipolar transistor Tr1 flows.

In the case of a semiconductor device using Si, the built-in potential is about 1 V, so the pnp bipolar transistor Tr1 turns on immediately. When the pnp bipolar transistor Tr1 is turned on, holes are injected from the pn-junction into the drift layer ND, so that conductivity modulation occurs and the resistance of the drift layer ND decreases. Next, current flow between the collector electrode CE and the emitter electrode EE to which the pnp bipolar transistor Tr1 is connected.

However, in a case of a semiconductor device using SiC, the built-in potential is about 3 V, so that no current flow between the collector electrode CE and the emitter electrode EE unless a potential higher than the built-in potential is applied between the collector C and the emitter E.

In the case of the semiconductor device of the above described examined example, since the pn-junction composed the drift layer ND and the collector region CR is uniformly formed with respect to the collector electrode CE. Therefore, in order for the current to flow through the IGBT, it is necessary to apply a high voltage than the built-in potential between the collector C and the emitter E.

On the other hand, in the first embodiment, the Schottky barrier diode SBD is formed by the drift layer ND and the collector electrode CE by providing a plurality of locations where the drift layer ND and the collector electrode CE are directly joined.

Since the Schottky barrier diode SBD operates at a potential lower than the built-in potential, it can flow current between the collector electrode CE and the emitter electrode EE when a collector-emitter voltage is relatively low, that is, when a voltage lower than the built-in potential is applied between the collector C and the emitter E.

Next, when a potential equal to or higher than the built-in potential is applied between the collector C and the emitter E, the pnp bipolar transistor Tr1 is turned on, and the current mainly flowing through the collector region CR becomes main.

Figure 18:
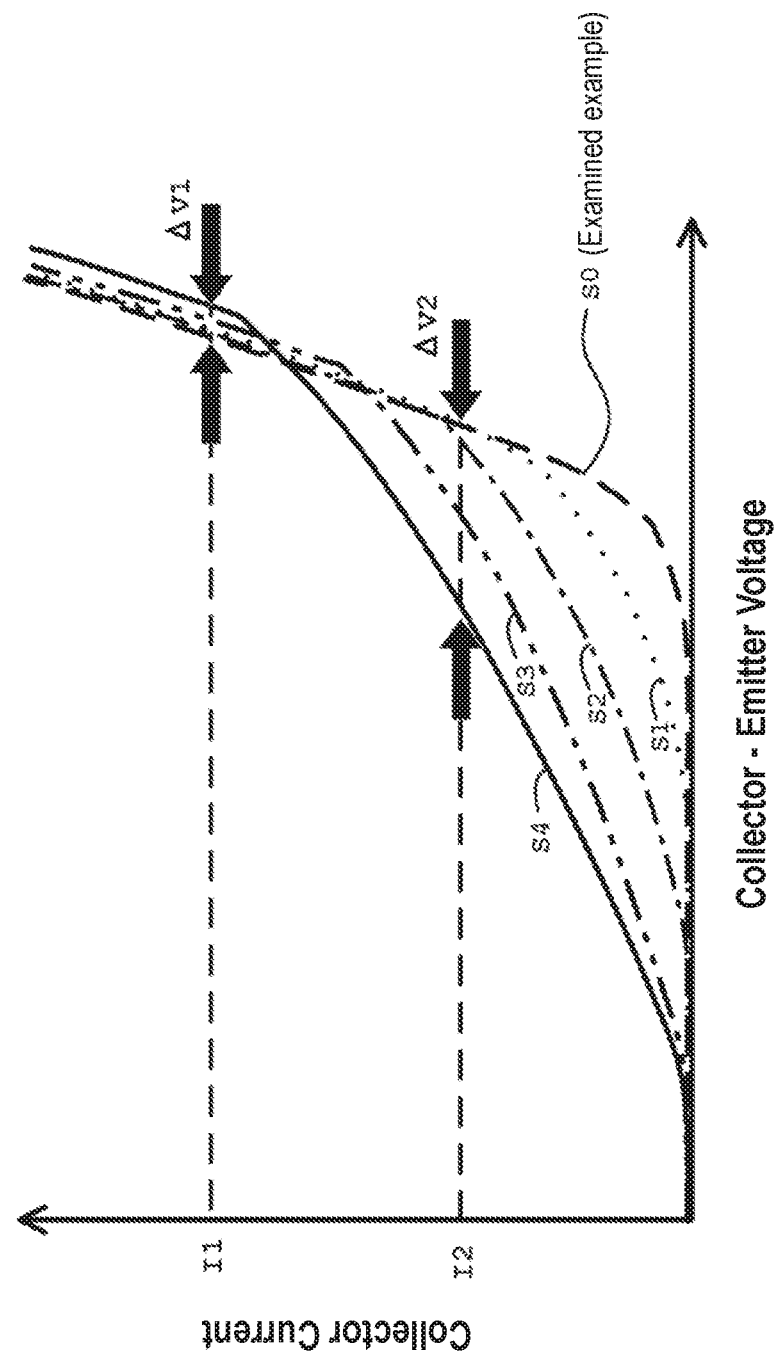
FIG. 18 is a diagram showing calculation results of characteristics of a collector current with respect to a collector-emitter voltage when a predetermined interval between a collector region is changed in the semiconductor device according to the first embodiment, together with calculation results of the examined example.

An effect of the first embodiment will be described below with reference to FIG. 18. FIG. 18 is a diagram showing a result of a simulation performed by inventor. FIG. 18 shows not only results of the first embodiment but also results of the above mentioned examined example as comparative study.

FIG. 18 shows calculation results of a collector current characteristic with respect to the collector-emitter voltage (hereinafter referred to as a current-voltage characteristic) when the predetermined interval S of the collector region CR (see FIG. 3) is changed in the semiconductor device of the first embodiment, together with calculated results of the examined example.

In FIG. 18, S0 shows a characteristic when the predetermined interval S between the collector regions CR is zero, that is, in a case of the examined example in which the collector region CR is uniformly formed with respect to the collector electrode CE. In this case, it can be seen that the collector current does not flow unless a relatively high voltage is applied between the collector C and the emitter E, that is, the offset voltage is high.

On the other hand, when the predetermined interval S of the collector region CR is increased from zero, the current-voltage characteristic changes from S0 to S4. In this case, as the predetermined interval S of the collector region CR increases, even if a voltage applied between the collector C and the emitter E is relatively small, it can be seen that current flow in the collector C. That is, it can be seen that the offset-voltage when the current flow through the IGBT is lowered.

Here, to define two currents of a first current I1 and a second current I2 in the current-voltage characteristic of FIG. 18. The first current I1 is a current flow mainly through the collector region CR by conductivity modulation. The second current I2 is a current flow mainly through the Schottky barrier diode SBD between the drift layer ND and the collector electrode CE. The first current I1 is, for example, 600 A/cm², and the second current I2 is, for example, 300 A/cm².

Figure 19:
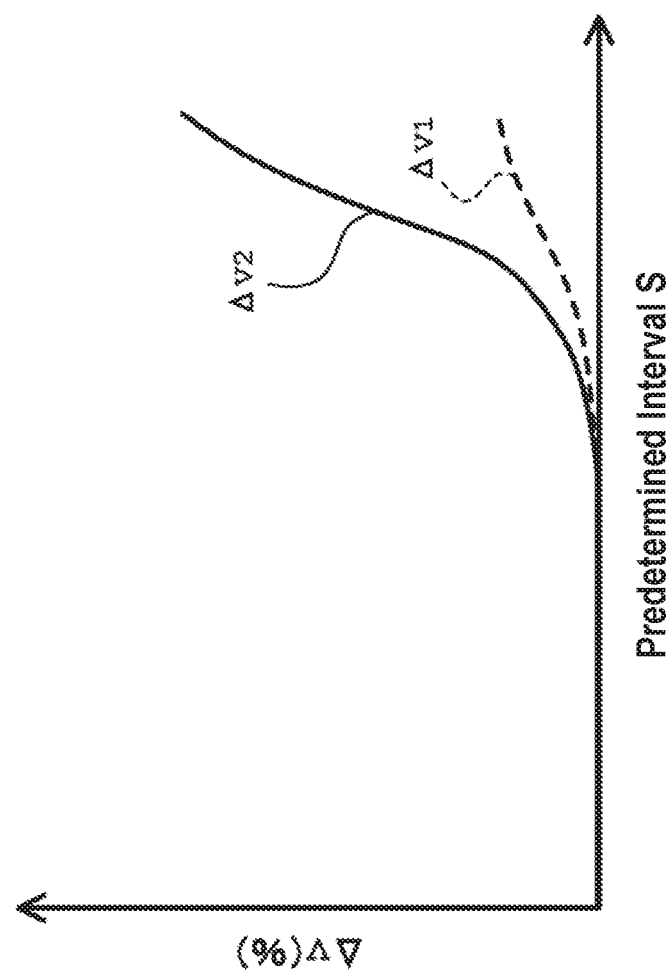
FIG. 19 is a diagram showing calculation results of change amounts in the collector-emitter voltage in a current region flowing through the collector region and a current region flowing in a Schottky barrier diode, respectively, when a predetermined interval between the collector region is changed in the semiconductor device according to the first embodiment.

FIG. 19 is a diagram showing calculation results of an amount of change in the collector-emitter voltage for the current flow through the collector region CR (first current I1) and the current flow through the Schottky barrier diode SBD (second current I2) respectively when the predetermined interval S between the collector regions CR is changed in the semiconductor device of the first embodiment.

Here, a difference between a voltage value that is the first current I1 of S1 to S4 and a voltage value that is the first current I1 of S0 is ΔV1, and a difference between a voltage value that is the second current I2 of S1 to S4 and a voltage value that is the second current I2 of S0 is ΔV2.

It can be seen that when the predetermined interval S between the collector regions CR is relatively small, ΔV2 hardly changes, but when the predetermined interval S between the collector regions CR becomes larger than a certain value, ΔV2 changes greatly. That is, as described above, it can be seen that the offset voltage when the current flow through the IGBT decreases as the predetermined interval S between the collector regions CR increases.

On the other hand, similarly to ΔV2, ΔV1 hardly changes when the predetermined interval S between the collector regions CR is relatively small, but ΔV1 changes greatly when the predetermined interval S between the collector regions CR becomes larger than the certain value. This means that if the predetermined interval S between the collector regions CR is made too large, the path of the current flow through the collector region CR becomes relatively narrow, and the on-resistance of the first current I1 is increased. Therefore, the on-resistance of a current flow through the offset voltage and the collector region CR, there is so-called trade-off relationship.

That is, the offset voltage can be lowered by forming the Schottky barrier diode SBD in which the drift layer ND and the collector electrode CE are directly joined between the collector regions CR. On the other hand, if the predetermined interval S between the regions where the Schottky barrier diode SBD is formed, that is, the collector region CR is too large, the on-resistance of the current flow through the collector region CR becomes high and characteristics of the IGBT deteriorate. Therefore, it is desirable that the predetermined interval S between the collector region CR is within a predetermined range. The predetermined range is, for example, 1 μm or more and 2.5 μm or less, preferably 1.4 μm or more and 2.2 μm or less.

As described above, in the first embodiment, by setting the predetermined interval S in the above range, even when a voltage between the collector C and the emitter E is relatively low, that is, when a voltage lower than the built-in potential is applied between the collector C and the emitter E, the offset voltage when the current flow through the IGBT can be lowered. Further, it is possible to suppress increasing the on-resistance when voltage higher than the built-in potential is applied between the collector C and the emitter E.

As a modified example of the first embodiment, a peak position of the impurity concentration in the collector region CR will be described.

Figure 20:
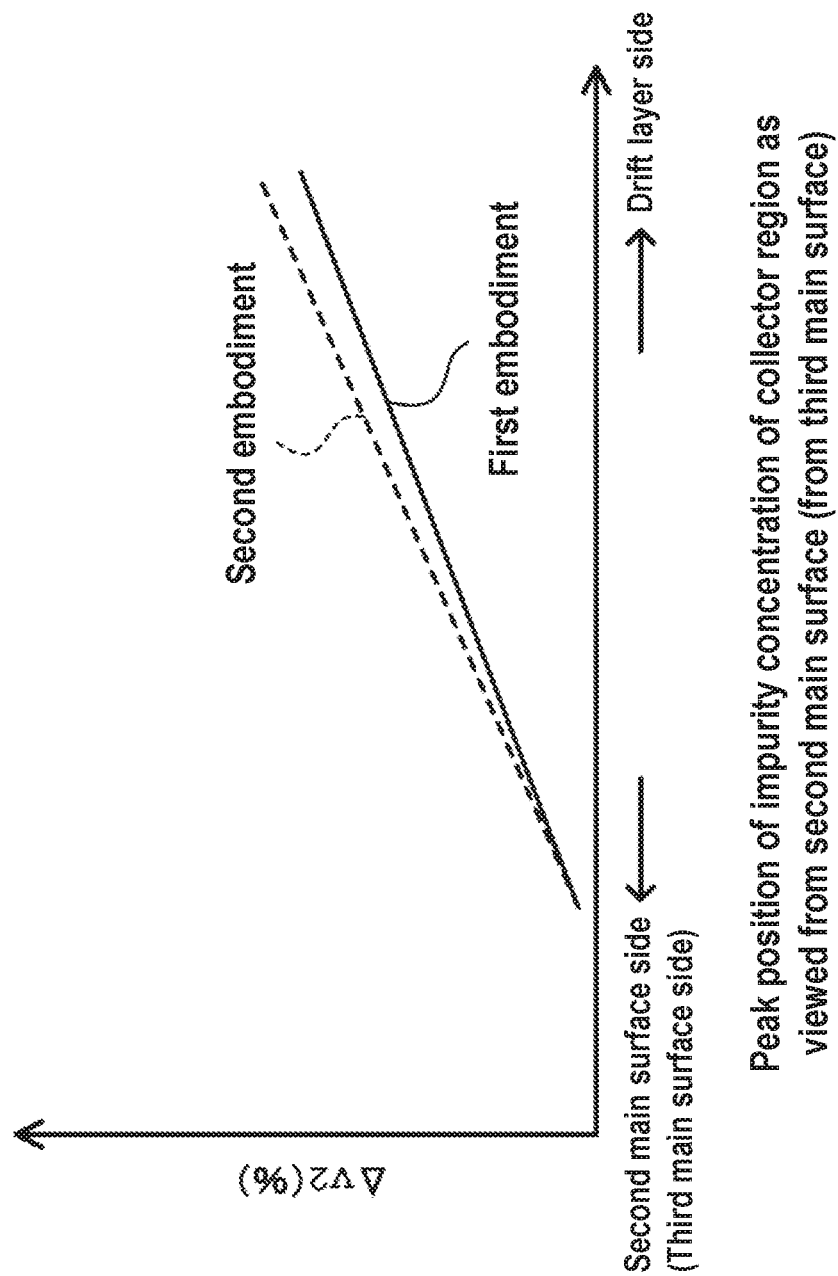
FIG. 20 is a diagram showing calculation results of change amounts in the collector-emitter voltage corresponding to a current flow through the Schottky barrier diode when a peak position of an impurity concentration in the collector region is changed for the semiconductor device according to the first embodiment and a semiconductor device according to a second embodiment, respectively.

FIG. 20 is a diagram showing calculation results of an amount of change in the collector-emitter voltage for the current flow through the Schottky barrier diode SBD (second current I2) when the peak position of the impurity concentration in the collector region CR is changed when in viewed at a depth distance from the second main surface SF2 (third main surface SF3 in a second embodiment). FIG. 20 shows not only results of the first embodiment but also a result of the second embodiment described later.

It can be seen that a rate of change of ΔV2 with respect to a voltage value of S0 depends on a peak position of an impurity concentration of the collector region CR, and that the rate of change of ΔV2 with respect to the voltage value of S0 is larger as the peak position of the impurity concentration of the collector region CR is deeper as seen from the second main surface SF2.

Here, the peak position of the impurity concentration of the collector region CR is separated from the second main surface SF2, and the peak position of the impurity concentration of the collector region CR is located on a side of the drift layer ND in the collector region CR.

More specifically, when an impurity in the collector region CR is aluminum (Al), the peak position of the impurity concentration of the collector region CR as viewed from the second main surface SF2 is deeper than 1 μm, for example, and more preferably 1.3 μm or more.

Thus, by improving the peak position of the impurity concentration of the collector region CR, it is possible to further reduce the offset voltage when the current flow through the IGBT.

Second Embodiment

Structure of a Semiconductor Device According to the Second Embodiment

Figure 21:
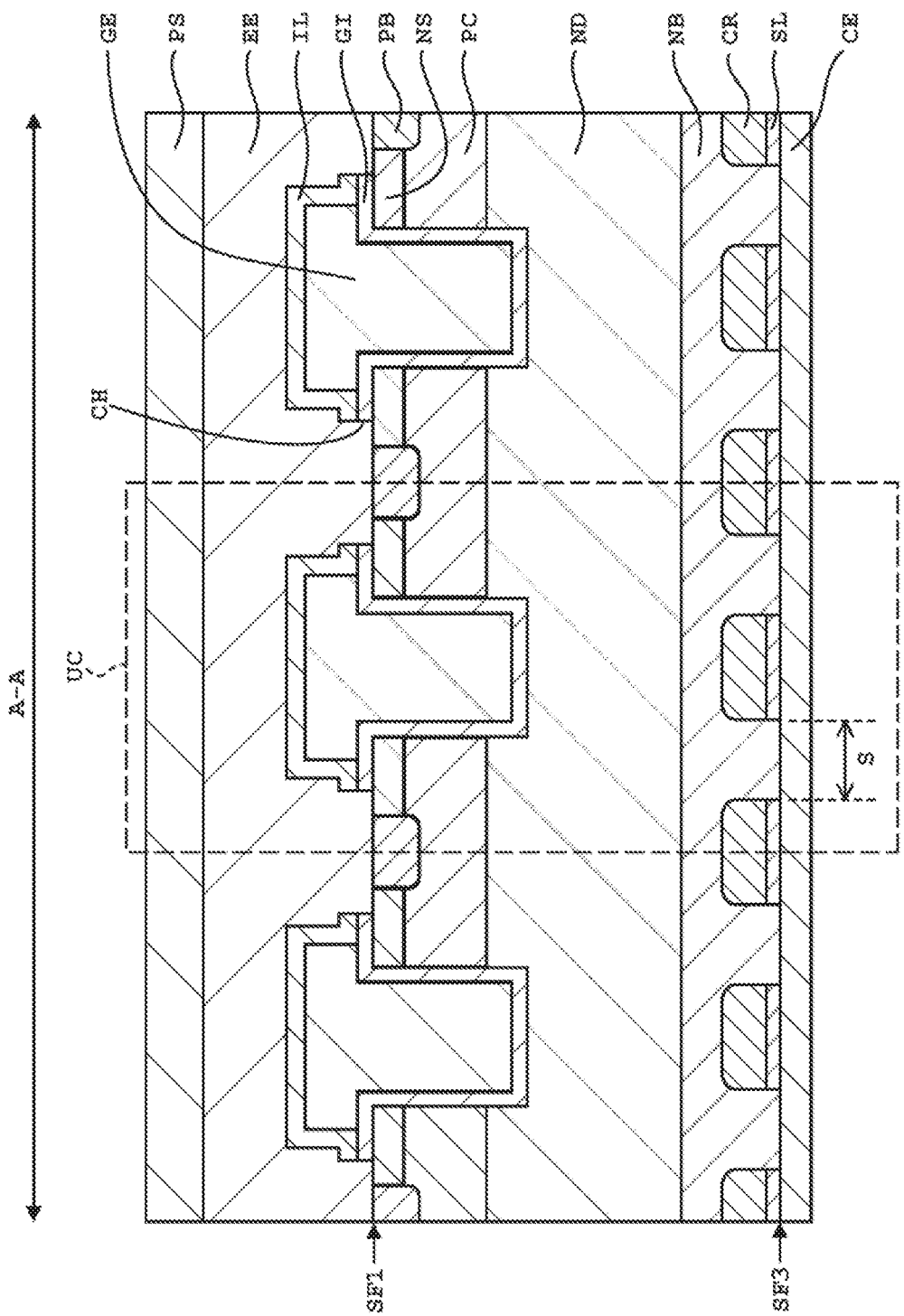
FIG. 21 is a main portion cross-sectional view of the semiconductor device according to the second embodiment.

The semiconductor device of the second embodiment will be described below with reference to FIG. 21. Main portion plan view of the semiconductor device of the second embodiment is omitted because it is the same as FIG. 2. FIG. 21 is a cross-sectional view taken along line A-A of FIG. 2 and corresponds to FIG. 3 of the first embodiment.

As shown in FIG. 21, in the second embodiment, a structures of the drift layer ND and a layer above the drift layer ND are the same as those of the first embodiment. However, the second embodiment differs from the first embodiment in that a buffer region NB is formed between the drift layer ND and the collector region CR and between the drift layer ND and the collector region CR.

The buffer region NB is, for example, an n-type semiconductor region, and is an impurity region formed in the drift layer ND by ion implantation method. The buffer region NB is a region provided for a purpose of suppressing a depletion layer extending from the drift layer ND when a voltage is applied between the collector C and the emitter E. Therefore, an impurity concentration of the buffer region NB is higher than that of the drift layer ND. The buffer region NB impurity concentration is, for example, $1\times10^{18}$ cm$^{-3}$ or more and $5\times10^{18}$ cm$^{-3}$ or less, preferably $2\times10^{18}$ cm$^{-3}$ or more and $4\times10^{18}$ cm$^{-3}$ or less. A thickness of the buffer region NB (thickness in a depth direction with reference to the third main surface SF3 in FIG. 21) is 2 μm or more, and 4 μm or less.

By setting the impurity concentration of the buffer region NB higher than the impurity concentration of the drift layer ND, it is possible to suppress the depletion layer at an interface between the buffer region NB and the collector electrode CE. As a result, the buffer region NB and the collector electrode CE can be made ohmic contact (bonding).

A bottom surface of the buffer region NB (third main surface SF3) side, similarly to the first embodiment, the plurality of collector regions CR are formed at the predetermined interval S in the direction (second direction, X direction in FIG. 2) intersecting the direction in which the trench TR extends (first direction, Y direction in FIG. 2). That is, in plan view, the plurality of collector regions CR are formed so as to be embedded in the buffer region NB at the predetermined interval S in the direction intersecting the direction in which the trench TR extends. In addition, similar to the first embodiment, the predetermined interval S can be freely selected.

The plurality of pn-junctions are formed by contacting the buffer region NB and the plurality of collector regions CR. The pnp bipolar transistor formed by adding the channel region PC to the pn-junction constitutes a part of the IGBT.

The collector electrode CE made of metal film is formed so as to cover the buffer region NB and the collector region CR. Similar to the first embodiment, silicide layers SL are formed between the collector regions CR and the collector electrodes CE. And the silicide layers SL are not formed at a portion where the buffer region NB and the collector electrode CE are bonded to each other. Other configurations are similar to those of the first embodiment.

From the above, in the semiconductor device of the second embodiment, both the buffer region NB and the collector region CR via the silicide layer SL on the second main surface SF2 side of the drift layer ND are connected to the collector electrode CE.

The main features and effects of the second embodiment will be described referring back to FIG. 20. Similarly to the above, also in the semiconductor device of the second embodiment, it can be seen that the rate of change of ΔV2 with respect to the voltage value of S0 depends on the peak position of the impurity concentration of the collector region CR. And it can be seen that a deeper peak position of the impurity concentration of the collector region CR from the third main surface SF3, the greater the rate of change of ΔV2 with respect to the voltage value of S0. And also it can be seen that the semiconductor device of the second embodiment has a larger rate of change with respect to S0 of ΔV2 regardless of a peak position of the impurity concentration than the semiconductor device of the first embodiment.

In the second embodiment, the buffer region NB and the collector electrode CE are in ohmic contact (junction), not in Schottky barrier contact (junction). Compared with the first embodiment, the offset voltage when current flow through the IGBT can be further reduced, even when a resistance between the buffer region NB and the collector electrode CE decreases, and a voltage lower than the built-in potential is applied between the collector C and the emitter E.

Further, the semiconductor device of the second embodiment has the buffer region NB between the drift layer ND and the collector region CR, the depletion layer can remain in the drift layer ND when a voltage is applied between the collector C and the emitter E. as a result, it is possible to suppress punch-through.

Manufacturing Method of the Semiconductor Device of the Second Embodiment

A manufacturing method of the semiconductor device of the second embodiment will be described below with reference to FIGS. 22 to 23. In order to simplify description, only an area corresponding to the unit cell UC in FIG. 21 is shown.

In the manufacturing method of the second embodiment, similarly to the manufacturing method of the first embodiment, the semiconductor substrate SB made of SiC on which the epitaxial layer NE is formed is prepared (see FIG. 4). At this time, in the second embodiment, since the buffer region NB is formed between the drift layer ND and the collector region CR, the epitaxial layer NE is formed thicker than the buffer region NB in order to obtain the same dielectric breakdown voltage performance as the semiconductor device of the first embodiment. For example, when the thickness of the buffer region NB is 3.0 μm, the epitaxial layer NE preferably has a thickness of, for example, about 15 μm.

Subsequent manufacturing method of the second embodiment is similar to that of FIG. 12 described in the first embodiment.

Figure 22:
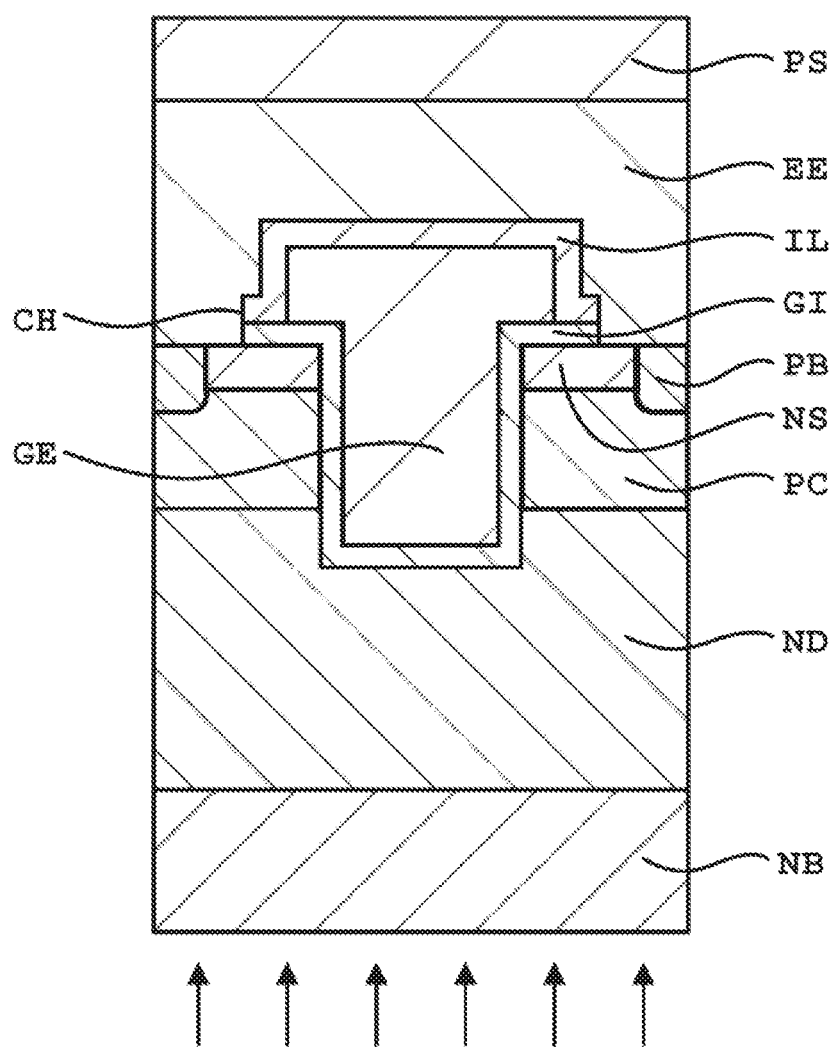
FIG. 22 is a cross-sectional view during a manufacturing process of the semiconductor device according to the second embodiment following FIG. 12.

FIG. 22 shows a manufacturing process subsequent to FIG. 12, and shows a forming process of the buffer region NB. First, polishing process is performed on the bottom surface of the semiconductor substrate SB so as to remove the semiconductor substrate SB so as to expose the third main surface SF3 of the drift layer ND. Next, nitrogen (N) ions are uniformly implanted with respect to the third main surface SF3 of the drift layer ND. The buffer region NB has a thickness of, for example, about 3.0 μm.

Figure 23:
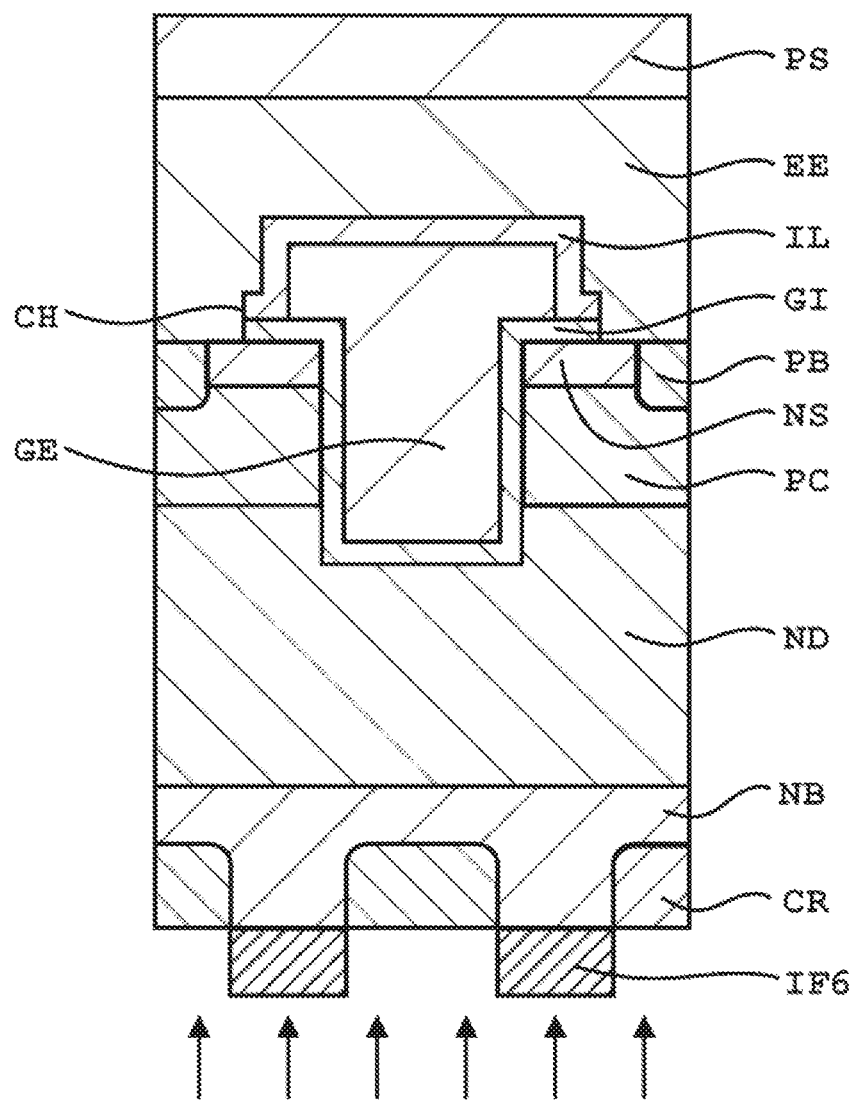
FIG. 23 is a cross-sectional view during the manufacturing process of the semiconductor device according to the second embodiment following FIG. 22.

Next, as shown in FIG. 23, an insulating film IF6 made of, for example, silicon oxide is formed on a bottom surface of the buffer region NB by, for example, CVD method. Next, the insulating film IF6 is patterned by photolithography and etching process. At this time, the insulating film IF6 is patterned at predetermined interval S in the direction (first direction, Y direction in FIG. 2) intersecting the direction in which the gate electrode GE extends (second direction, X direction in FIG. 2). Next, the patterned insulating film IF6 as a mask, by performing ion implantation using aluminum (Al) ions, the plurality of collector regions CR on the third main surface SF3 of the buffer region NB is selectively formed. Since a peak impurity concentration and a thickness of the plurality of collector regions CR are the same as those of the first embodiment, description thereof will be omitted.

Next, silicide layers SL are formed on the third main surface SF3 of the buffer region NB, as shown in FIG. 21. Since the silicide layers SL are formed in the same manner as in the first embodiment, description thereof will be omitted.

Next, the collector electrode CE is formed on the third main surface SF3 of the collector electrode CE (see FIG. 21). Since the collector electrode CE is formed in the same manner as in the first embodiment, the collector electrode CE will not be described. Thus, the semiconductor device shown in FIG. 21 is manufactured.

What is claimed is:

1. A semiconductor device, comprising:
   a semiconductor layer of a first conductivity type having a first main surface and a second main surface opposed to the first main surface and configured to contain silicon and carbon;
   a first impurity region of a second conductivity type opposed to the first conductivity type formed on the first main surface;
   a second impurity region of the first conductivity type formed on the first main surface to contact the first impurity region;
   a trench which penetrates the first impurity region and the second impurity region and reaches the semiconductor layer and extend in a first direction in plan view;
   a gate insulating film formed in the trench;
   a gate electrode embedded in the trench with the gate insulating film interposed therebetween;
   a plurality of third impurity regions of the second conductivity type selectively formed in the second main surface; and
   a metal film formed to cover the second main surface,
   wherein the plurality of third impurity regions are arranged at a predetermined interval in a second direction intersecting the first direction in plan view,
   wherein the metal film contacts both of the semiconductor layer and the plurality of third impurity regions in the second main surface,
   wherein a silicide layer is formed between the metal film and the plurality of third impurity regions,
   wherein the metal film is connected to the plurality of third impurity regions via the silicide layer, and
   wherein the silicide layer is not formed between the metal film and the semiconductor layer.

2. The semiconductor device according to claim 1, wherein a metal layer including titanium is formed between the metal film and the semiconductor layer.

3. The semiconductor device according to claim 1, wherein the predetermined interval is 1 μm or more and 2.5 μm or less.

4. The semiconductor device according to claim 1,
   wherein the metal film is in ohmic contact with the plurality of third impurity regions, and
   wherein the metal film is in Schottky contact with the semiconductor layer and a Schottky barrier diode is formed by the metal film and the semiconductor layer.

5. The semiconductor device according to claim 1, wherein a peak position of an impurity concentration of the plurality of third impurity regions is located in a side of the semiconductor layer in view at a depth direction with reference to the second main surface.

6. The semiconductor device according to claim 5, wherein the peak position of the impurity concentration of the plurality of third impurity regions is located deeper than 1 μm from the second main surface in view at the depth direction with reference to the second main surface.

7. A semiconductor device, comprising:
   a semiconductor layer of a first conductivity type having a first main surface and a second main surface opposed to the first main surface and configured to contain silicon and carbon;
   a first impurity region of a second conductivity type opposed to the first conductivity type formed on the first main surface;
   a second impurity region of the first conductivity type formed on the first main surface to contact the first impurity region;
   a trench which penetrates the first impurity region and the second impurity region and reaches the semiconductor layer and extend in a first direction in plan view;
   a gate insulating film formed in the trench;
   a gate electrode embedded in the trench with the gate insulating film interposed therebetween;
   a third impurity region of the first conductivity type formed in the second main surface and having a higher impurity concentration than the semiconductor layer thereof;
   a plurality of fourth impurity regions of the second conductivity type selectively formed in the third impurity region in the second main surface; and
   a metal film formed to cover the second main surface,
   wherein the plurality of fourth impurity regions are arranged at a predetermined interval in a second direction intersecting the first direction in plan view,
   wherein the metal film contacts both of the third impurity region and the plurality of fourth impurity regions in the second main surface,
   wherein a silicide layer formed between the metal film and the plurality of fourth impurity regions,
   wherein the metal film is connected to the plurality of fourth impurity regions via the silicide layer, and
   wherein the silicide layer is not formed between the metal film and the third impurity region.

8. The semiconductor device according to claim 7, wherein a thickness of the third impurity region in a depth direction with respect to the second main surface is 2 μm or more and 4 μm or less.

9. The semiconductor device according to claim 7, wherein the metal film is in ohmic contact with both of the third impurity region and the plurality of fourth impurity regions.

10. A manufacturing method of a semiconductor device, comprising the steps of:

(a) preparing a semiconductor substrate configured to contain silicon and carbon, a semiconductor layer of a first conductivity type having a first main surface and a second main surface opposed to the first main surface in contact with the semiconductor substrate;
(b) forming a first impurity region of a second conductivity type opposed to the first conductivity type;
(c) forming a second impurity region of the first conductivity type in the first main surface so as to contact the first impurity region;
(d) forming a trench which penetrates the first impurity region and the second impurity region and reaches the semiconductor layer and extend in a first direction in plan view;
(e) forming a gate insulating film in the trench;
(f) forming a gate electrode so as to embed in the trench with the gate insulating film interposed therebetween;
(g) removing the semiconductor substrate;
(h) selectively forming a plurality of third impurity regions of the second conductivity type in the second main surface; and
(i) forming a metal film so as to cover the second main surface,
wherein the plurality of third impurity regions are arranged at a predetermined interval in a second direction intersecting the first direction in plan view and
wherein the metal film contacts both of the semiconductor layer and the plurality of third impurity regions in the second main surface.

11. The manufacturing method of the semiconductor device according to claim 10, further comprising a step of:
(j) after the step (e) before the step (h), selectively forming a silicide layer on the plurality of third impurity regions.

* * * * *